US012809272B2

(12) United States Patent
Sreenivasan et al.

(10) Patent No.: US 12,809,272 B2
(45) Date of Patent: Nov. 24, 2026

(54) NANOSCALE PROGRAMMABLE PRECISION PROFILING WITH MICROSCALE PIXEL CONTROL

(71) Applicant: Board of Regents, The University of Texas System, Austin, TX (US)

(72) Inventors: Sidlgata V. Sreenivasan, Austin, TX (US); Parth Pandya, Austin, TX (US); David Choi, Austin, TX (US); Anant Jain, Austin, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 34 days.

(21) Appl. No.: 18/861,337

(22) PCT Filed: Apr. 29, 2023

(86) PCT No.: PCT/US2023/020500

§ 371 (c)(1),
(2) Date: Oct. 29, 2024

(87) PCT Pub. No.: WO2023/212381

PCT Pub. Date: Nov. 2, 2023

(65) Prior Publication Data

US 2025/0284204 A1 Sep. 11, 2025

Related U.S. Application Data

(60) Provisional application No. 63/336,901, filed on Apr. 29, 2022.

(51) Int. Cl.
*G03F 7/00* (2006.01)
*G01B 11/06* (2006.01)

(52) U.S. Cl.
CPC ...... *G03F 7/70625* (2013.01); *G01B 11/0675* (2013.01); *G03F 7/0002* (2013.01); *G01B 2210/56* (2013.01)

(58) Field of Classification Search
CPC ............... G03F 7/70625; G03F 7/0002; G01B 11/0675; G01B 2210/56
See application file for complete search history.

(56) References Cited

U.S. PATENT DOCUMENTS 9,415,418 B2 8/2016 Sreenivasan et al.
9,718,096 B2 8/2017 Sreenivasan et al.
(Continued)

FOREIGN PATENT DOCUMENTS

WO WO-2021173873 A1 * 9/2021 ............. B05D 3/067
WO 2021252389 A1 12/2021

OTHER PUBLICATIONS

International Preliminary Report on Patentability for International Application No. PCT/US2023/020500 dated Nov. 7, 2024, pp. 1-9.
(Continued)

*Primary Examiner* — Jamil Ahmed
(74) *Attorney, Agent, or Firm* — Robert A. Voigt, Jr.; Shackelford, McKinley & Norton, LLP

(57) ABSTRACT

A system for nanoscale precision programmable profiling. The system includes a first film stack with a superstrate, a substrate and a liquid profiling material in between the superstrate and the substrate, where the first film stack absorbs energy from photons in a range of deep ultraviolet to long-wave infrared. Furthermore, the system includes a second film stack with a solid profiling material located on the substrate, where there is a refractive index difference at an interface of the substrate and the solid profiling material. The refractive index difference enables a film thickness measurement subsystem to measure a thickness profile of the solid profiling material. Additionally, the system includes a thermal actuation subsystem to locally heat the first film stack to enable movement of the liquid profiling material.

11 Claims, 32 Drawing Sheets

(56) References Cited

U.S. PATENT DOCUMENTS

| | | | |
|---|---|---|---|
| 2013/0312809 | A1 | 11/2013 | Luch et al. |
| 2015/0179839 | A1 | 6/2015 | Van Duren et al. |
| 2016/0318066 | A1 | 11/2016 | Sreenivasan et al. |

OTHER PUBLICATIONS

International Search Report for International Application No. PCT/US2023/020500 dated Sep. 27, 2023, pp. 1-4.

Kapur et al., “A Review of Gravure Coating Systems,” Convertech & e-Print, Jul./Aug. 2011, pp. 56-60.

Written Opinion of the International Searching Authority for International Application No. PCT/US2023/020500 dated Sep. 27, 2023, pp. 1-7.

Office Action for Taiwanese Patent Application No. 112116197 dated Aug. 25, 2026, pp. 1-7.

* cited by examiner

| Material | Thickness | k[W/mK] | rho [kg/m^3] | Cp [J/kgK] |
|---|---|---|---|---|
| PC | 150 µm | 0.22 | 1150 | 1250 |
| Resist (Acrylic) | 500 µm | 0.18 | 1180 | 1470 |
| Silicon | 500 µm | 131 | 2329 | 700 |

FIG. 22E

| Material | Thickness | k[W/mK] | rho [kg/m^3] | Cp [J/kgK] |
|---|---|---|---|---|
| PC | 150 µm | 0.22 | 1150 | 1250 |
| Resist (Acrylic) | 500 µm | 0.18 | 1180 | 1470 |
| PC | 500 µm | 0.22 | 1150 | 1250 |

NANOSCALE PROGRAMMABLE PRECISION PROFILING WITH MICROSCALE PIXEL CONTROL

TECHNICAL FIELD

The present invention relates generally to the fabrication of nanostructures, and more particularly to nanoscale programmable precision profiling with microscale pixel control.

BACKGROUND

Nanostructures, nanomaterials, and nanocomposites can be fabricated using various techniques. One technique is the top-down approach which involves lateral patterning of bulk materials by either subtractive or additive methods to realize nano-sized structures. Several methods are used to fabricate nanostructures using the top-down approach, such as photolithography, scanning lithography, laser machining, soft lithography, nanocontact printing, nanosphere lithography, colloidal lithography, scanning probe lithography, ion implantation, diffusion, deposition, etc. Another technique is the bottom-up approach in which nanostructures are fabricated by building upon single atoms or molecules. In this method, controlled segregation of atoms or molecules occurs as they are assembled into desired nanostructures (2-10 nm size range).

Unfortunately, these techniques are deficient in terms of high-throughput fabrication of functional nanostructures with complex geometries on planar and non-planar substrates.

SUMMARY

In one embodiment of the present disclosure, a system for nanoscale precision programmable profiling of a substrate using a superstrate comprises a profiling module, where the profiling module dispenses profiling material using one or more of the following techniques to dispense the profiling material: inkjet dispense, slot-die coating, and gravure coating. The system further comprises a subsystem for handling the superstrate, where the superstrate is a flexible web and is used to form a contiguous film of the profiling material between the superstrate and the substrate, and where the flexible web is held in one of the following configurations: roll-to-roll and in a tape frame. The system additionally comprises a film stack comprising the superstrate, the substrate and the profiling material in between the superstrate and the substrate, where the film stack absorbs energy from photons in one or more bands in a wavelength range between 200 nm and 15 μm, and where there is a refractive index difference at the substrate and an interface of the profiling material or between the superstrate and the interface of the profiling material. Furthermore, the system comprises a metrology module comprising a film thickness measurement subsystem, where the refractive index difference enables the film thickness measurement subsystem to measure a thickness profile of the profiling material. Additionally, the system comprises a thermal actuation subsystem to locally heat the film stack to enable movement of the profiling material, where the thermal actuation subsystem comprises a source of radiation in one or more bands within a wavelength range between 200 nm and 15 μm. In addition, the system comprises a curing module for curing the profiling material.

In another embodiment of the present disclosure, a system for nanoscale precision programmable profiling comprises a profiling module, where the profiling module dispenses profiling material using one or more of the following techniques to dispense the profiling material: inkjet dispense, slot-die coating, and gravure coating. The system further comprises a subsystem for handling a superstrate, where the superstrate is a flexible web and is used to form a contiguous film of the profiling material between the superstrate and a substrate, and where the flexible web is held in one of the following configurations: roll-to-roll and in a tape frame. The system additionally comprises a curing module for curing the profiling material. Furthermore, the system comprises a first film stack with the superstrate, the substrate and the profiling material in between the superstrate and the substrate, where the first film stack absorbs energy from photons in one or more bands in a wavelength range between 200 nm and 15 μm. Additionally, the system comprises a second film stack with the cured profiling material located on the substrate, where there is a refractive index difference at an interface of the substrate and the cured profiling material, and where the refractive index difference enables a film thickness measurement subsystem to measure a thickness profile of the cured profiling material. In addition, the system comprises a thermal actuation subsystem to locally heat the first film stack to enable movement of the profiling material.

In a further embodiment of the present disclosure, a method for atline control in a nanoscale precision programmable profiling process comprises forming a first film stack by bringing a superstrate in contact to a substrate with a first liquid profiling material in between the superstrate and the substrate. The method further comprises curing the first liquid profiling material to result in a first solidified profiling material after a first predetermined time of film evolution using one or more of the following techniques: ultraviolet (UV) curing, thermal curing, and visible light curing. The method additionally comprises removing the superstrate from the first solidified profiling material. Furthermore, the method comprises measuring a film thickness of the first solidified profiling material on the substrate. Additionally, the method comprises forming a second film stack by bringing the superstrate in contact to the substrate with a second liquid profiling material in between the superstrate and the substrate. In addition, the method comprises applying a thermal load to the second liquid profiling material for film evolution. The method further comprises curing the second liquid profiling material to result in a second solidified profiling material after a second predetermined time of film evolution.

In another embodiment of the present disclosure, a method for inline closed loop control in a nanoscale precision programmable profiling process comprises forming a film stack by bringing a superstrate in contact to a substrate with a liquid profiling material in between the superstrate and the substrate. The method further comprises continuously measuring a film thickness of the liquid profiling material on the film stack. The method additionally comprises applying a thermal actuation for evolution of the liquid profiling material to minimize an error between the measured film thickness of the liquid profiling material and a desired liquid film profile. Furthermore, the method comprises curing the liquid profiling material to result in a solidified profiling material when the error is below a desired specification. Additionally, the method comprises removing the superstrate from the solidified profiling material.

In a further embodiment of the present disclosure, a process for depositing thin films comprises dispensing drops of a pre-cursor liquid organic material at a plurality of locations on a substrate by an array of inkjet nozzles. The process further comprises closing a gap between a superstrate and the substrate thereby allowing the drops to form a contiguous film captured between the substrate and the superstrate, where the superstrate consists of a flexible web held in a tape frame. The process additionally comprises selecting parameters of the superstrate to enable increased time to an equilibrium state thereby enabling capture of non-equilibrium transient states of the superstrate, the contiguous film and the substrate. Furthermore, the process comprises curing the contiguous film to solidify it into a solid. Additionally, the process comprises separating the superstrate from the solid thereby leaving a polymer film on the substrate.

In another embodiment of the present disclosure, a process for depositing intentionally non-uniform films for controlling a total thickness variation of semiconductor wafers comprises obtaining a desired non-uniform film thickness profile. The process further comprises solving an inverse optimization program to obtain a volume and a location of dispensed drops so as to minimize a norm of error between the desired non-uniform film thickness profile and a final film thickness profile consistent with a desired final profile of the semiconductor wafers such that a volume distribution of the final film thickness profile is a function of the volume and the location of the dispensed drops. The process additionally comprises dispensing drops of a pre-cursor liquid organic material at a plurality of locations on a wafer by an array of inkjet nozzles. Furthermore, the process comprises closing a gap between a superstrate and the wafer to form a contiguous film captured between the wafer and the superstrate, where the superstrate is a flexible web held in a tape frame. Additionally, the process comprises obtaining a time to a non-equilibrium transient state of the superstrate, the contiguous film and a substrate by using the inverse optimization scheme. In addition, the process comprises curing the contiguous film to solidify it into a polymer. The process further comprises separating the superstrate from the polymer thereby leaving a polymer film on the wafer, where the wafer has an initial nominal thickness ranging from 20 micrometers to 1.5 mm.

In a further embodiment of the present disclosure, a process for imprint lithography comprises dispensing drops of a pre-cursor liquid organic material at a plurality of locations on a substrate by an array of inkjet nozzles. The process further comprises closing a gap between a patterned replica template and the substrate thereby allowing the drops to form a contiguous film captured between the substrate and the patterned replica template, where the patterned replica template consists of a flexible web held in a tape frame configuration. The process additionally comprises curing the contiguous film to solidify it into a solid. Furthermore, the process comprises separating the patterned replica template from the solid thereby leaving a polymer film on the substrate.

The foregoing has outlined rather generally the features and technical advantages of one or more embodiments of the present disclosure in order that the detailed description of the present disclosure that follows may be better understood. Additional features and advantages of the present disclosure will be described hereinafter which may form the subject of the claims of the present disclosure.

BRIEF DESCRIPTION OF THE DRAWINGS

A better understanding of the present disclosure can be obtained when the following detailed description is considered in conjunction with the following drawings, in which:

FIGS. 22A-22E illustrate the thermal simulations for quantifying the temperature profile based on a heat input at a film stack consisting of a polycarbonate superstrate, a silicon substrate and an imprint resist film in accordance with an embodiment of the present disclosure;

DETAILED DESCRIPTION

Figure 1:
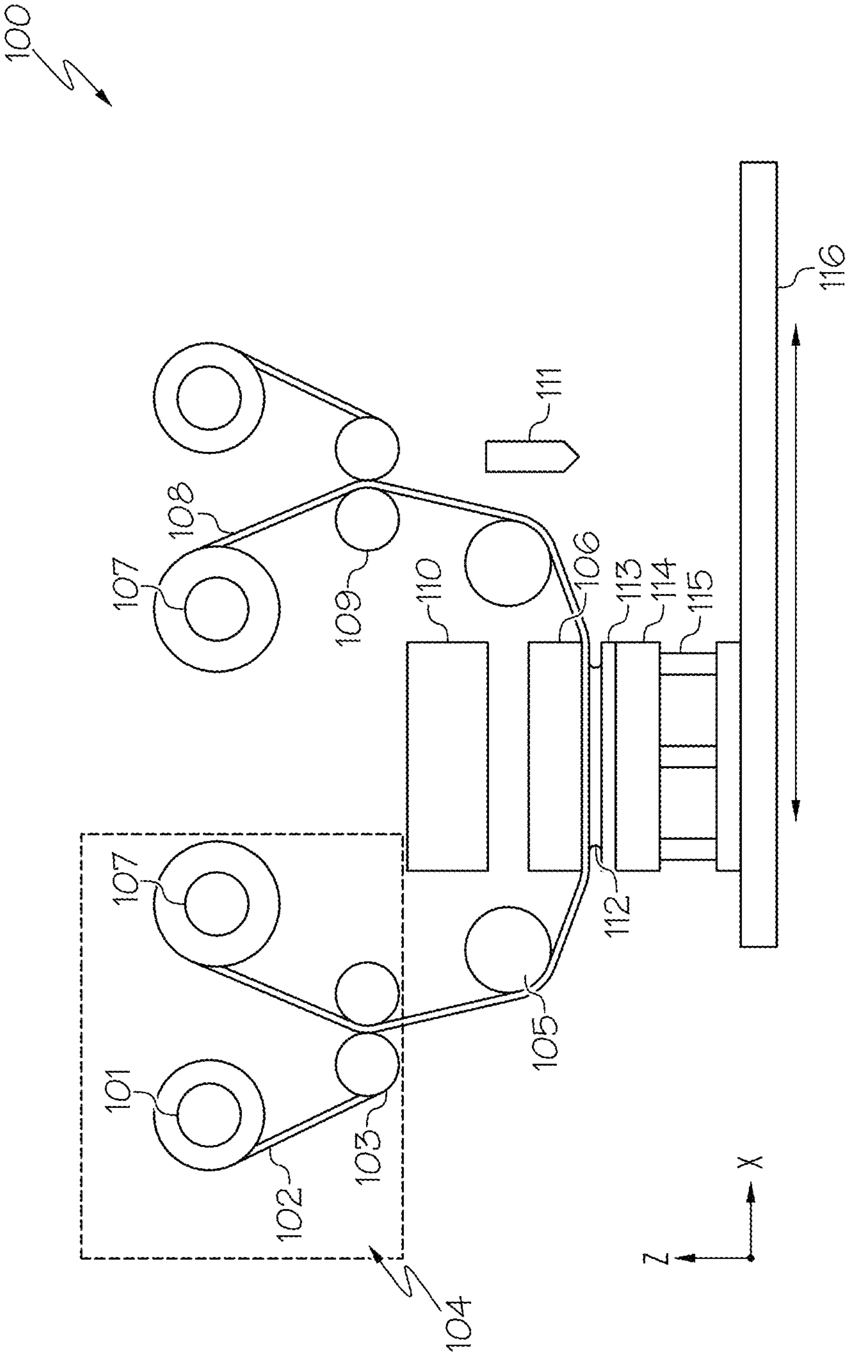
FIG. 1 illustrates a front view of the nP3 module architecture in accordance with an embodiment of the present disclosure.

As stated in the Background section, nanostructures, nanomaterials, and nanocomposites can be fabricated using various techniques. One technique is the top-down approach which involves lateral patterning of bulk materials by either subtractive or additive methods to realize nano-sized structures. Several methods are used to fabricate nanostructures using the top-down approach, such as photolithography, scanning lithography, laser machining, soft lithography, nanocontact printing, nanosphere lithography, colloidal lithography, scanning probe lithography, ion implantation, diffusion, deposition, etc. Another technique is the bottom-up approach in which nanostructures are fabricated by building upon single atoms or molecules. In this method, controlled segregation of atoms or molecules occurs as they are assembled into desired nanostructures (2-10 nm size range).

Unfortunately, these techniques are deficient in terms of high-throughput fabrication of functional nanostructures with complex geometries on planar and non-planar substrates.

The embodiments of the present disclosure provide a means for providing high-throughput fabrication of functional nanostructures with complex geometries on planar and non-planar substrates as discussed below.

The principles of the present disclosure are directed to a process called Nanoscale Programmable Precision Profiling with Microscale Pixel Control (nP3-μP). A discussion regarding such a process is provided in International Application No. PCT/US2021/019732, which is incorporated by reference herein in its entirety. Nanometer-precise film profiles are fabricated on transparent and opaque substrates using the nP3 process. The μP process is then applied to increase film profile precision by 2-50×, by substantially decreasing the error between the desired profile and the achieved profile. Instances of the apparatus used for performing the process in real-time and in an atline manner are described herein. In one embodiment, a flexible web, mounted on a web handling system capable of removing a protective film from the web and reapplying a protective film, is used as a superstrate. An inkjet is used to dispense a programmable pattern of UV curable resist on a substrate or superstrate. Once the superstrate and substrate are brought in contact with each other, in one embodiment, the resist drops merge and an initial film profile is created. A thin film metrology system is described herein which measures large area film thickness profiles. Furthermore, a thermal actuation system is described herein which generates a spatial temperature profile with a lateral micrometer-level precision on the film stack in order to make corrections to the liquid film profile. The error between the measured film profile as obtained from thin film measurements and the desired profile is used to calculate the required thermal actuation load via thermo-capillary simulations. This process is performed until the film profile error is within specification. The superstrate and substrate modifications necessary to make them amenable to the nP3-μP process are also described herein.

In addition to the nP3 apparatus, the microscale pixel control module contains the metrology subsystem.

In the metrology subsystem, the RGB/monochromatic camera is used to measure reflection spectra over visible and near infrared (NIR) wavelengths obtained by thin film interference over the illuminated area on the substrate-resist-superstrate film stack. Furthermore, in one embodiment, the metrology subsystem includes a telecentric lens for low distortion imaging of the illuminated area on the film stack. Additionally, in one embodiment, the metrology subsystem includes broadband light sources or multi-wavelength LED sources to be used as incident light for thin film interference.

Furthermore, in one embodiment, the microscale pixel control module contains the subsystem of thermal actuation for microscale pixel control. In one embodiment, such a subsystem includes a high power laser diode (visible (VIS) or infrared (IR)) as the source of irradiation on the film stack. In one embodiment, such a subsystem includes digital micromirror devices (DMD) to direct a high power laser onto the film stack and generate spatial temperature profiles. In one embodiment, such a subsystem includes a low power visible laser for alignment. In one embodiment, such a subsystem includes aspheric lenses, cylindrical lenses and heat sinks for mounting and collimating laser diodes. Additionally, in one embodiment, such a subsystem includes motorized YZ stages to direct DMD-based irradiation over different locations of a large area film stack.

Additionally, in one embodiment, the microscale pixel control module contains the subsystem for UV curing. In one embodiment, in such a subsystem, it contains a broadband ultraviolet (UV) source or an ultraviolet A (UVA) laser collimated onto a film stack for curing of the resist after the process.

Furthermore, in one embodiment, the microscale pixel control module contains the subsystem for the components for the optical path. In one embodiment, such a subsystem includes beam splitters and dichroic mirrors to allow using the same optical path for thin film metrology, DMD-based irradiation and UV curing.

In one embodiment, the process for atline nP3-μP is the following. In one embodiment, the nP3 process is performed, resist is UV cured and the superstrate is separated from the substrate. The substrate is traversed outside the nP3 profiling zone where the metrology light beam is directed to the profiled substrate from the resist side. Thin film interference measurements are performed over the entire substrate area and regions are identified that require thermal actuation with microscale pixel control for improvement in precision. The difference between the current film profile and the desired profile is calculated. Furthermore, a two-dimensional (2D) temperature profile is calculated through thermo-capillary modelling that needs to be applied to the regions of interest to produce the desired profile. Additionally, the substrate is traversed back to the nP3 profiling region, followed by resist dispense and superstrate application. Furthermore, the YZ stage is used to position the DMD to direct the high power optical beam towards these regions of interest and the DMD beam is irradiated on the film stack from the substrate side. Additionally, once the simulated thermal load is applied to the film stack, the resist is cured and the superstrate is removed. The substrate is again traversed outside of the nP3 profiling zone for further thin film interference measurements. This process is repeated until the film profile is within specifications.

In one embodiment, the process for real-time nP3-μP is the following. In one embodiment, once the nP3 process brings the superstrate in contact with the resist on the substrate and a film is formed, the metrology light beam is directed to the film stack from the substrate side while the resist is uncured and the superstrate is still in contact. Thin film interference measurements are performed continuously to observe film profile evolution up until the film profile stops changing. Using thin film interference based thickness measurements, regions are identified in the film profile which require thermal actuation with microscale pixel control for improvement in precision. In one embodiment, the YZ stage is used to position the DMD to direct the high power optical beam towards these regions of interest. In one embodiment, the difference between the current film profile and the desired profile is calculated. Furthermore, in one embodiment, a two-dimensional (2D) temperature profile is calculated through thermo-capillary modelling that needs to be applied to the regions of interest to produce the desired profile. In one embodiment, the DMD is used to irradiate the regions of interest producing the temperature profiles. Using continuous thin film interference measurements, film evolution is observed under thermal load. In one embodiment, in a closed-loop manner, the error between the current film profile and the desired film profile is measured at constant intervals and the thermal actuation required is calculated and applied through the DMD. Once the film profile meets the specifications, the DMD is turned off and the film stack is UV cured followed by superstrate separation. This leaves a layer of cured resist on the substrate that substantially meets the film profile specifications.

Referring now to FIG. 1, FIG. 1 illustrates a front view of the nP3 module architecture 100 in accordance with an embodiment of the present disclosure. As shown in FIG. 1, nP3 module 100 includes a motorized interleaf/de-interleaf rollers 101, interleaf film 102, nip roller 103, sidelay module 104, precision idlers 105, ultraviolet (UV) transparent vacuum chuck 106, motorized supply & take-up rollers 107, superstrate 108, drive roller 109, UV lamp 110, inkjet 111, resist (profiling material) 112, substrate 113, vacuum pin chuck 114, vertical-tip-tilt stage 115 and large travel stage 116.

Figure 2:
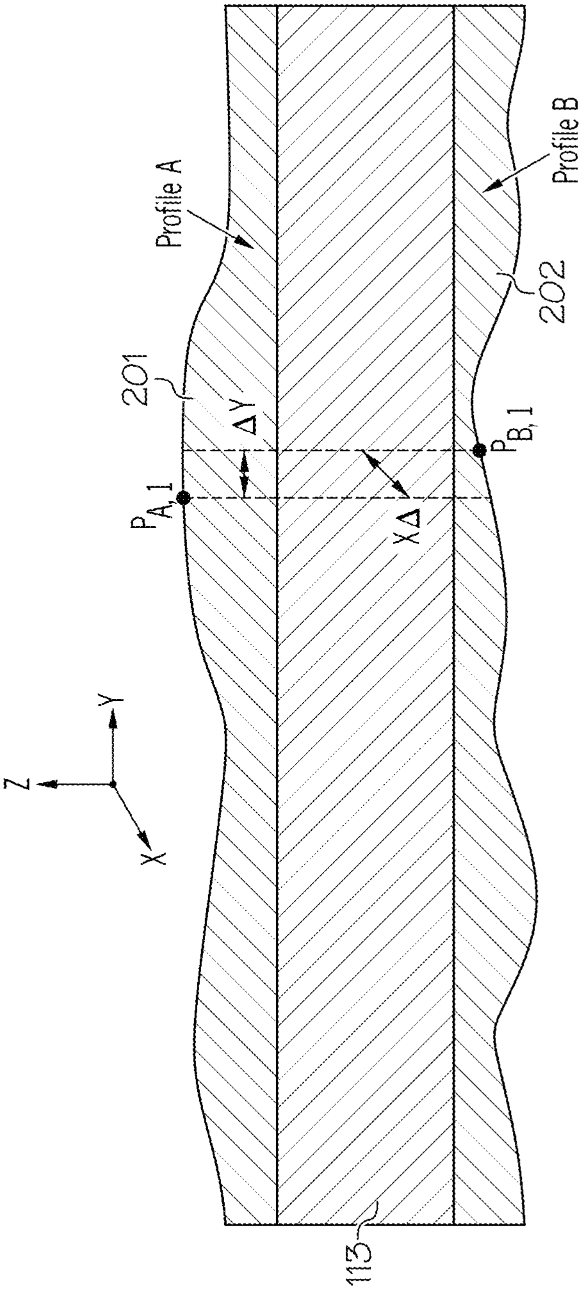
FIG. 2 illustrates nP3 with front and backside profiling in accordance with an embodiment of the present disclosure.

FIG. 2 illustrates nP3 with front and backside profiling in accordance with an embodiment of the present disclosure. In particular, FIG. 2 illustrates frontside profiling 201 (“Profile A”) and backside profiling 202 (“Profile B”) around substrate 113.

Referring to FIGS. 1 and 2, an instance of the apparatus for the nP3 (nanoscale programmable precision profiling) process is defined. In one embodiment, a liquid film is deposited on a substrate. The film thickness as a function of its lateral dimensions over its area (in-plane x, y) is called herein the “film profile.” Furthermore, this liquid film is referred to herein as the “liquid profiling material” (e.g., profiling material 112) which is designed to wet the substrate material and be curable. The substrate (e.g., substrate 113) can be rigid or flexible, substantially flat or curved. Furthermore, the substrate (e.g., substrate 113) can be patterned or un-patterned. In one embodiment, the typical materials for substrates (e.g., substrate 113) include silicon, fused silica and silicon carbide wafers, curved substrates, such as polycarbonate lens blanks, and flexible substrates, such as polyethylene terephthalate (PET) and polycarbonate sheets.

In one embodiment, the superstrate (e.g., superstrate 108) is a flexible web that is brought in contact with the substrate (e.g., substrate 113) with the liquid profiling material in between. In one embodiment, the flexible web is held in a roll-to-roll format. In one embodiment, the superstrate (e.g., superstrate 108) is a flexible sheet held in a frame. Examples of such frames include tape frames used for mounting semiconductor wafers prior to backgrinding and dicing and have automation capabilities consistent with requirements for semiconductor packaging. In one embodiment, the superstrate (e.g., superstrate 108) consists of a wafer glued to a flexible web held on a tape frame, where the primary superstrate surface could either be that of the flexible web or the wafer. In one embodiment, these wafers are used for modulating stiffness of the superstrate (e.g., superstrate 108) held in a tape-frame. These wafers could be made of silicon, oxide, SiC, alumina, sapphire, metal, polymer-based substrate, etc. Furthermore, the wafer could be one of the following sizes: 50 mm, 100 mm, 150 mm, 200 mm, 300 mm, and 450 mm in diameter (and also any intermediate sizes). Additionally, these substrates can be thinned using standard semiconductor processes, such as backgrinding, chemical mechanical polishing (CMP), etc. In one embodiment, the tape frame with flexible superstrate is cleaned using one or more of the following: water rinse, piranha cleaning, SC1/2 cleaning, and dry cleaning (e.g., plasma clean, cryogenic cleaning, dry $CO_2$ based cleaning). In one embodiment, the superstrate (e.g., superstrate 108) is a patterned replica template used for imprint lithography or un-patterned for nP3. In one embodiment, the patterned replica template is formed with micro- or nano-structures of polymers, metals and dielectrics.

In one embodiment, the profiling material (e.g., profiling material 112) is a liquid deposited by one or more of a combination of various dispensing systems, such as inkjets (e.g., inkjet 111), slot-die coaters and gravure coaters. In one embodiment, the drop pattern dispensed by the inkjet (e.g., inkjet 111) is programmable. The profiling material (e.g., profiling material 112) is deposited on either the substrate (e.g., substrate 113) or the superstrate (e.g., superstrate 108). In one embodiment, the superstrate (e.g., superstrate 108) is a flexible film, such as polycarbonate or PET. The superstrate (e.g., superstrate 108) is mounted in a roll-to-roll configuration between unwind and rewind rollers, such as rollers 109. In one embodiment, a protective interleaf film (e.g., interleaf film 102) is removed from the superstrate (e.g., superstrate 108) before processing and applied after processing. Capstan and nip rollers, such as nip roller 103, are used along the superstrate web path to provide tension on the superstrate web. A substantially flat region of the superstrate web is created between precision idlers (e.g., precision idlers 105).

In one embodiment, precision idlers (e.g., precision idlers 105) are non-motorized rollers mounted on precision stages to ensure parallelism and minimize alignment errors. This flat region of the superstrate web is used to make contact with the substrate (e.g., substrate 113) with the profiling material (e.g., profiling material 112) in between them. This combination of the superstrate (e.g., superstrate 108), substrate (e.g., substrate 113) and profiling material (e.g., profiling material 112) is called a film stack. The film stack can also exclude the superstrate (e.g., superstrate 108). The superstrate (e.g., superstrate 108) and substrate (e.g., substrate 113) are coated with various films to facilitate the process (described later herein). The profiling material (e.g., profiling material 112) used, called a resist, is typically an acrylate mixture that can be solidified by UV curing. The cured resist has a refractive index different from air. Exemplary resist formulations include a combination of hexyl acrylate, isobornyl acrylate and ethylene glycol diacrylate.

In one embodiment, the substrate (e.g., substrate 113) is mounted on a vertical-tip-tilt stage 115 and an XY linear stage (e.g., travel stage 116). In one embodiment, a UV lamp (e.g., UV lamp 110) is used to cure the resist (e.g., resist 112) in the film stack. In the nP3 process, the superstrate (e.g., superstrate 108) spreads the resist drops dispensed by the inkjets (e.g., inkjet 111) onto the substrate (e.g., substrate 113). The drops are allowed to merge to form a contiguous film. For a predetermined duration, the contiguous film is allowed to evolve. Once the duration is complete, the liquid resist is UV cured. This process is used to fabricate an initial film profile of resist (e.g., resist 112) on the substrate (e.g., substrate 113). A discussion regarding the methods for calculating the predetermined duration of film evolution mentioned above is provided in U.S. Pat. Nos. 9,415,418 and 9,718,096, which are incorporated by reference herein in their entirety.

Furthermore, a further discussion regarding nanoscale precision profiling as shown in FIG. 1 is discussed in international application number PCT/US2021/019732, which is incorporated by reference herein in its entirety. Furthermore, a discussion regarding applying nP3 to correct distortions on a waveguide substrate where the nP3 process is applied to the front and back side of the substrate and, where the distortions comprise image placement, magnification, displacement, dispersion and others, is discussed in international application number PCT/US2021/036244, which is incorporated by reference herein in its entirety. The front and backside profiles obtained through the nP3 process are called profile 'A' (201) and profile 'B' (202), respectively, as shown in FIG. 2. Every point on Profile A 201 corresponds to a point on Profile B 201. $P_{A,1}$ on Profile A 201 is an exemplary point corresponding to $P_{B,1}$ on Profile B 202. When projected along the Z-axis, $P_{A,1}$ and $P_{B,1}$ are perfectly aligned to each other (same X and Y coordinates) in an ideal case. In reality, the distance between the X and Y coordinates of $P_{A,1}$ and $P_{B,1}$ (i.e., ΔX and ΔY) can be less than 100 micrometers or 50 micrometers or 10 micrometers or 5 micrometers or 1 micrometer. In one embodiment, alignment is measured and corrected by scribing microscale alignment marks on the substrate (e.g., substrate 113), observing said alignment marks using a microscope and obtaining the desired alignment accuracy using stages with sub-micrometer precision.

Figure 3:
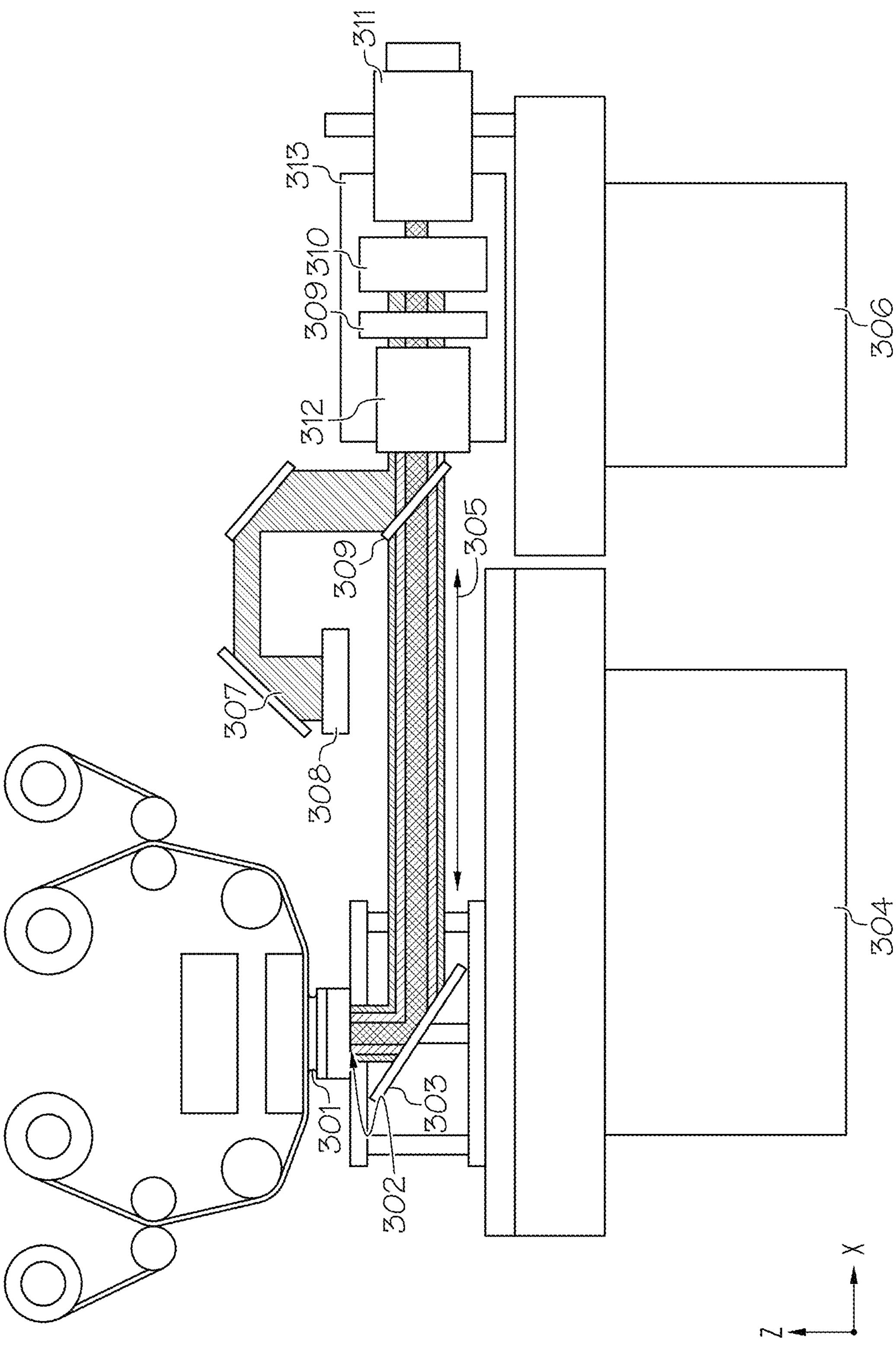
FIG. 3 illustrates an overall machine architecture showing the μP module with respect to the nP3 module in the front view in accordance with an embodiment of the present disclosure.

Referring now to FIG. 3, FIG. 3 illustrates an overall machine architecture showing the μP module with respect to the nP3 module in the front view in accordance with an embodiment of the present disclosure.

In particular, FIG. 3 illustrates a film stack 301 with the superstrate (e.g., superstrate 108), the location of the real-time thin film metrology (TFM) subsystem 302, a mirror 303 that is at approximately 45° to direct light beams along the Z-axis, a stationary table 304 for mounting nP3 components, an X-stage 305 to convey the substrate (e.g., substrate 113), a stationary table 306 for mounting μP components, light 307 reflected from film stack 301, the location of the atline TFM 308, a beam splitter 309, a dichroic mirror 310 in the XY plane, a DMD system 311, UV light 312 as well as a light source, telephoto lens and RGB camera (combination corresponds to element 313).

Figure 4:
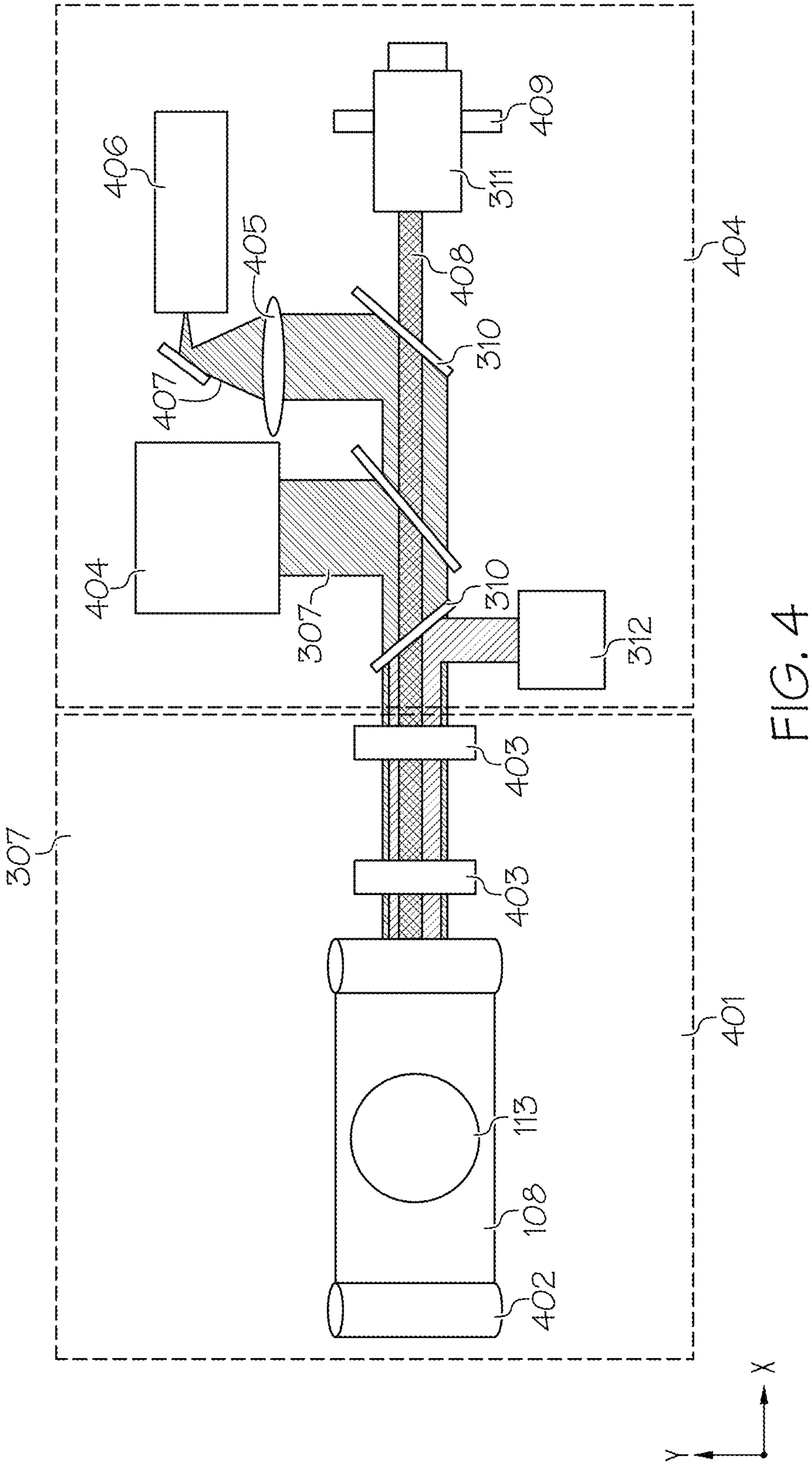
FIG. 4 illustrates the overall machine architecture showing the μP module with respect to the nP3 module in the top view in accordance with an embodiment of the present disclosure.

Referring now to FIG. 4, FIG. 4 illustrates the overall machine architecture showing the μP module with respect to the nP3 module in the top view in accordance with an embodiment of the present disclosure.

As shown in FIG. 4, FIG. 4 includes an nP3 station 401 which includes precision idlers 402 (similar to precision idlers 105 of FIG. 1), superstrate 108 of the film stack, such as film stack 301, substrate 113 of the film stack, such as film stack 301, and mirrors 403 to allow TFM at the atline position. Additionally, FIG. 4 includes a μP station 404 that includes light 307 reflected from the film stack, such as film stack 301, a telephoto lens and RGB camara (combination corresponds to element 404), an achromatic lens 405, a light source 406, an incident light path 407 on the film stack, such as film stack 301, UV light 312, a dichroic mirror 310, a light beam 408 to heat up the film stack, such as film stack 301, DMD system 311 and a high speed YZ stage 409.

Referring to FIGS. 3 and 4, an instance of the μP module (e.g., μP station 404) is shown along with the nP3 module (e.g., nP3 station 401). The μP module (e.g., μP station 404) is located adjacent to the nP3 module (e.g., nP3 station 401). In one embodiment, a granite table or a vibration isolation table is used to mount the sub-modules of the μP module (e.g., μP station 404).

In one embodiment, the equipment for thin film metrology and thermal actuation of the film stack, such as film stack 301, is shown in FIGS. 3 and 4. An optional UV lamp 312 is also placed on the μP table (e.g., μP station 404) for the purposed of UV curing the film stack (e.g., film stack 301) from the substrate side. In one embodiment, a 45 degree mounted mirror (e.g., mirror 303) is placed below the film stack (e.g., film stack 301) in the vertical-tip-tilt stage (e.g., 115 of FIG. 1). In one embodiment, this mirror is used to direct the light beams incoming from the μP module (e.g., μP station 404) towards the film stack, such as film stack 301. Along the X-stage on the nP3 module (e.g., nP3 station 401), there are locations for real-time thin film metrology and atline thin film metrology of the film stack (e.g., film stack 301). Real-time thin film metrology is defined herein as the thickness measurement of an evolving film at certain time intervals. Atline thin film metrology is defined herein as the film thickness measurement of a cured resist film which does not evolve with time. When the substrate (e.g., substrate 113) is located beneath the superstrate (e.g., superstrate 108) with liquid resist (e.g., resist 112) in between, the film evolution can be observed in real-time by a thin film metrology (TFM) subsystem. This is the location of real-time TFM (see element 302). When the superstrate (e.g., superstrate 108) is removed from this film stack (e.g., film stack 301) and the liquid resist (e.g., resist 112) is UV cured, the X-stage (e.g., X-stage 305) moves the substrate (e.g., substrate 113) away from the superstrate (e.g., superstrate 108) to the location of the atline TFM (see element 308). In one embodiment, a combination of mirrors is used to direct the light beams of the TFM to the film stack (e.g., film stack 301) at the atline TFM location. The TFM subsystem shown in FIG. 3 is based on thin film interference (a phenomena where the light waves reflected from the upper and lower boundaries of a thin film interfere constructively or destructively) and calculates the film thickness by illuminating the film stack (e.g., film stack 301) with light and measuring the reflection spectra.

In one embodiment, real-time TFM allows for closed-loop film thickness control but requires powerful computing hardware with real-time operating systems to perform measurements at an acceptable bandwidth. The bandwidth of the system is defined from the transient time constants of the film profile evolution and limited by the frames per second (FPS) of the imaging system. To achieve a measurement bandwidth of approximately 100 FPS for a high definition image, real-time computers typically require parallel processing on GPU (graphics processing unit) cores. Faster algorithms can be used for real-time TFM but they can reduce the precision of measurement. Atline TFM allows precise thin film measurements due to no bandwidth requirements for the metrology system but only allow for feedforward film thickness control. Thermal actuation in this process is defined as applying a locally varying non-uniform two-dimensional (2D) heat flux to a film stack (e.g., film stack 301) for a given duration to enable film profile changes due to changes in surface tension of the liquid profiling material (e.g., profiling material 112).

In one embodiment, the thermal actuation module consists of a directed heat source towards the film stack (e.g., film stack 301). In one embodiment, digital micromirror arrays (DMD) of DMD system 311 built by Texas Instruments® are used to direct high power laser beams to the film stack (e.g., film stack 301) which create a spatially varying temperature field over a given area. The DMD of DMD system 311 typically consists of approximately a million individually controlled microscale mirrors. This is used to obtain temperature profiles on the film stack (e.g., film stack 301) with micro-pixel control in the lateral directions. The lateral dimensions of the pixels on the film stack can be adjusted to be less than 10 μm or less than 50 μm or less than 100 μm. This allows the creation of a temperature difference on the film stack (e.g., film stack 301) with a micrometer-scale spatial wavelength. In one embodiment, the thermal actuation system with the DMD is mounted on a motorized YZ stage (e.g., YZ stage 409) to allow thermal actuation of different regions of large substrates. Motorized stages are typically driven by rotary or linear DC motors or stepper motors and use bearings, such as roller bearings, air bearings, flexure bearings, etc. In one embodiment, the specification for film thickness error is calculated by the difference between the measured film profile and the desired profile and expressed as a combination of peak-to-valley or root mean square (RMS) error.

In one embodiment, the incident light from the TFM light source is directed to the film stack (e.g., film stack 301) via a combination of optical components. An achromatic lens (e.g., achromatic lens 405) is used to ensure collimation of all wavelengths from the light source, such as light source 406. The focal length of the achromatic lens (e.g., achromatic lens 405) is chosen based on the required diameter of the incident light beam. In an instance of the apparatus, dichroic mirrors 310 are used. A dichroic mirror 310 includes a coating which reflects certain wavelengths and transmits certain wavelengths. The angle of incidence is typically 45 degrees or 0 degrees. The dichroic mirror, such as dichroic mirror 310, directly downstream of the TFM light source (e.g., light source 406) and the DMD system (e.g., DMD system 311) reflects light in the visible and near IR range and transmits light in the short-wave infrared (SWIR) and mid-infrared (MIR) range. In one embodiment, the DMD system (e.g., DMD system 311) emits SWIR wavelengths, and the TFM light source emits visible to NIR. This allows the light beams originating from the TFM light source and the DMD source to share the same light path. Further downstream of these light paths, another dichroic mirror (e.g., dichroic mirror 310) and a UV light source (e.g., UV light 312) is used. The second dichroic mirror (e.g., dichroic mirror 310) transmits everything from visible wavelengths to IR and reflects UV wavelength. This allows all the 3 incident beams to share the same path. The light from the DMD system (e.g., DMD system 311) and the UV system are not reflected back from the film stack, such as film stack 301. In one embodiment, the light incident from the TFM source is reflected back from the film stack (e.g., film stack 301) and the image is collected in an image sensor via a telephoto lens (see, e.g., element 404). A beam splitter (e.g., beam splitter 309) is placed directly upstream of the telephoto lens as shown in FIG. 3. This ensures that reflected light from the film stack (e.g., film stack 301) following the same path is directed to the TFM imaging system.

The following table (Table 1) illustrates information pertaining to exemplary inkjet printheads to dispense profiling material.

TABLE 1

| Make | Model | Min. Drop Vol. (pL) | Width (mm) | DPI | Frequency (kHz) | No. of Rows | Re-circulation |
|---|---|---|---|---|---|---|---|
| Xaar | 5601 | 3 | 116 | 1200 | 100 | 4 | |
| Xaar | 1003 GS6U | 6 | 70.5 | 360 | 27 (binary)/6 (8 grey levels) | 2 | Yes |
| Xaar | 1003 AMP | 1 | 70.5 | 360 | 6-12 | 2 | Yes |
| Xaar | 501 GS8 | 8 (Swedish: 5) | 70.5 | 180 | 8 | 1 | No |
| Xaar | 2001 + GS6U | 6 | 70.5 | 720 | 35 (binary)/6 (8 grey levels) | 4 | |
| Xaar | 1201 | 2.5 | 27 | 600 | 50 | 4 | |
| Fujifilm | Samba GL3 | 2.4 | 43 | 1200 | 100 | 32 | |
| Sll Printek | RC1200 | 13 | 108 | 360 | ~35 | 4 | |
| Konica | R1024 | 6 | 72 | 360 | 30 | 2 | |
| Kyocera | KJ4B-1200 | 1.5 | 112 | 1200 | 64 | 1 | |

Figure 5:
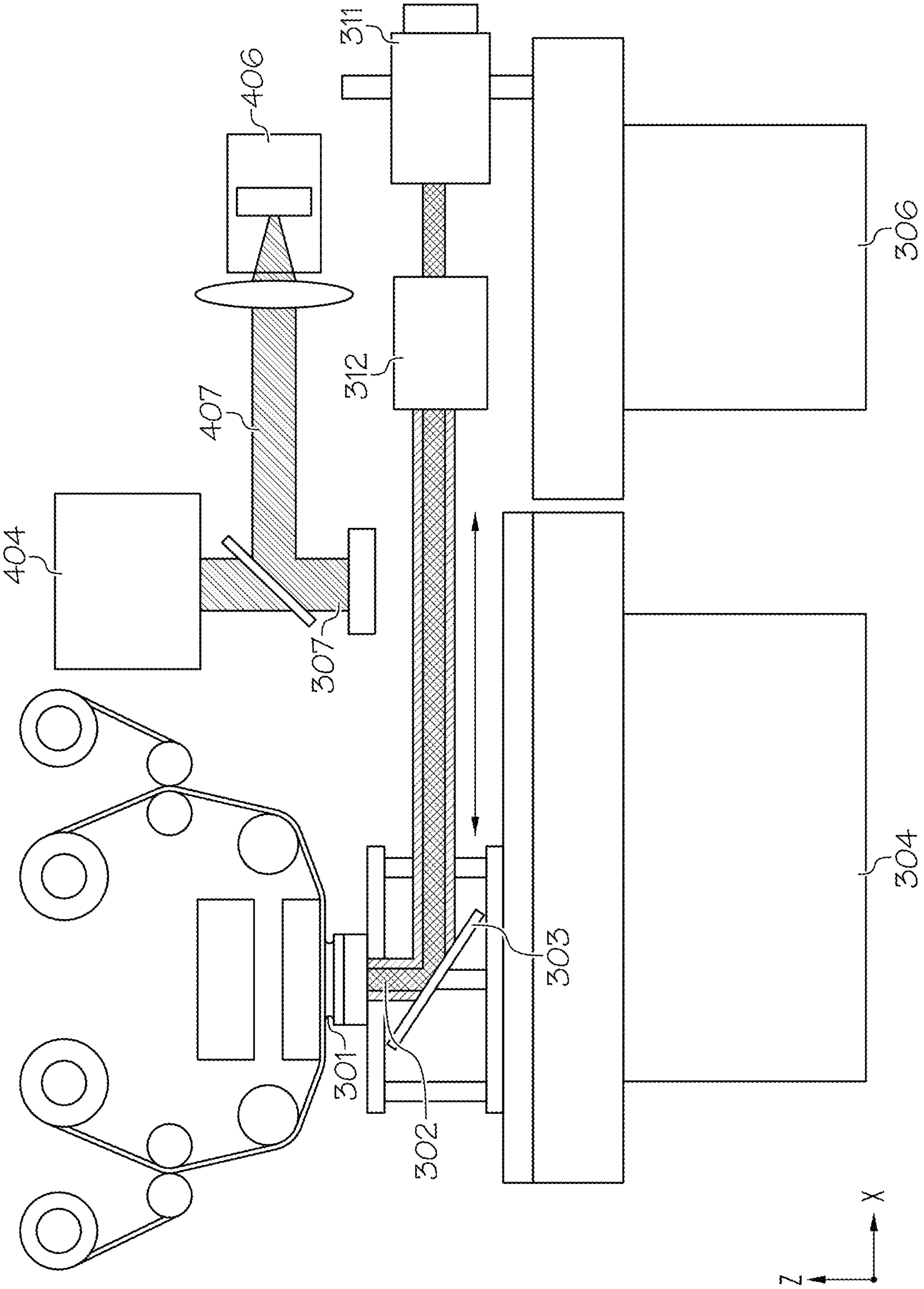
FIG. 5 illustrates an alternative architecture showing the μP module with respect to the nP3 module in the front view in accordance with an embodiment of the present disclosure.

Referring now to FIG. 5, FIG. 5 illustrates an alternative architecture showing the µP module with respect to the nP3 module in the front view in accordance with an embodiment of the present disclosure. As illustrated in FIG. 5, such an embodiment has many of the same components as shown in FIGS. 3 and 4.

Figure 6:
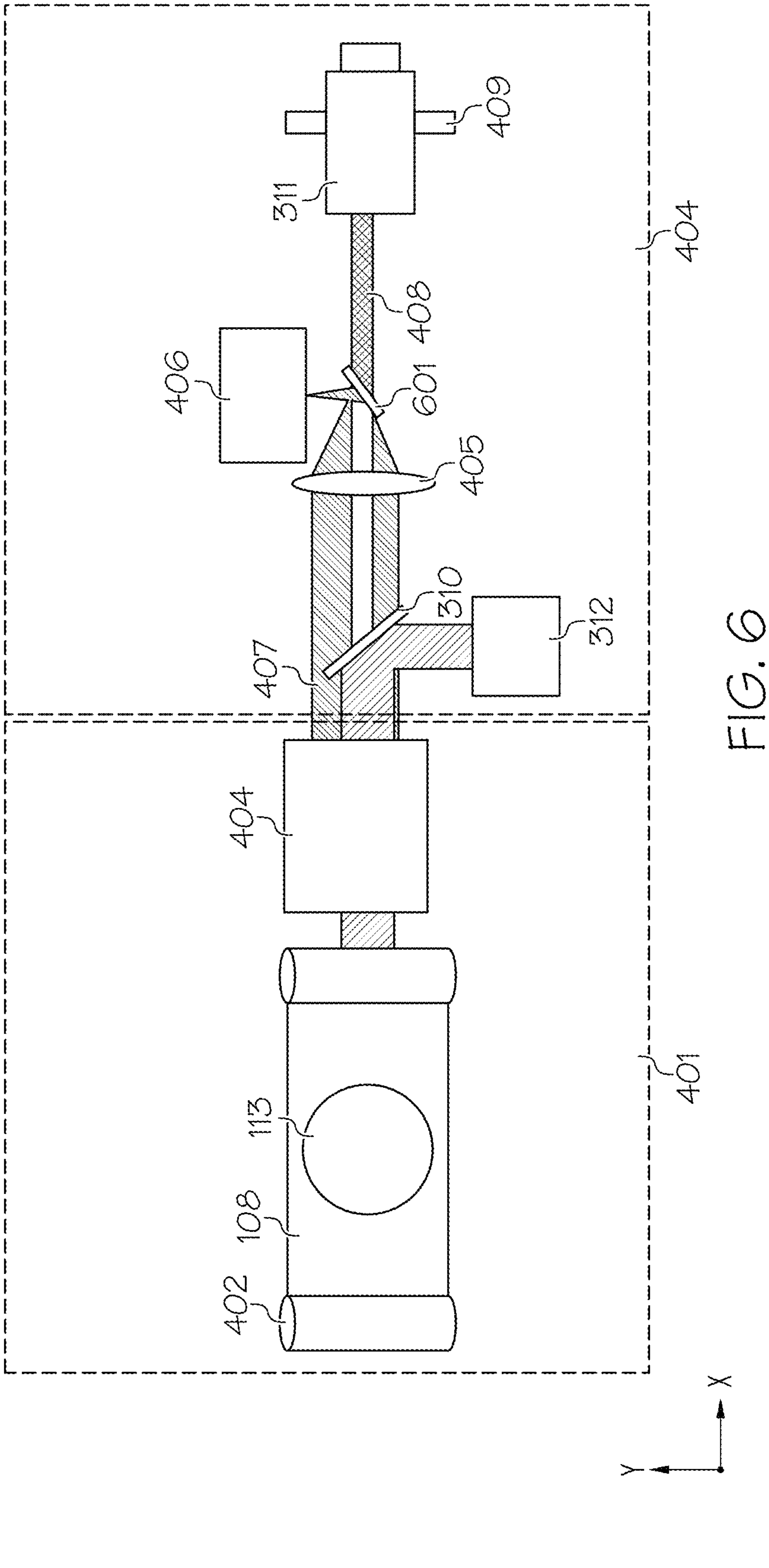
FIG. 6 illustrates an alternative architecture showing the μP module with respect to the nP3 module in the top view in accordance with an embodiment of the present disclosure.

Referring now to FIG. 6, FIG. 6 illustrates an alternative architecture showing the µP module with respect to the nP3 module in the top view in accordance with an embodiment of the present disclosure. As illustrated in FIG. 6, such an embodiment has many of the same components as shown in FIGS. 3 and 4 as well as mirror 601 used to direct light from light source 406 to achromatic lens 405.

A description regarding these Figures, FIGS. 5 and 6, is provided below.

FIGS. 5 and 6 illustrate an alternative architecture of the µP module to address the design challenges present in the TFM imaging system. In one embodiment, the TFM telephoto lens is designed for specific working differences and depth of fields. In one embodiment, the film stack (e.g., film stack 301) is to be within this acceptable working distance. Furthermore, mounting the TFM telephoto lens may require an exceptionally large working distance and depth of field, which can affect image quality by reducing image contrast and the dynamic range of the system. The architecture of FIGS. 5 and 6 places the TFM telephoto lens directly above the film stack (e.g., film stack 301) at the atline TFM location (e.g., see element 308 of FIG. 3). Such an architecture ensures maximum TFM resolution in the atline method.

Figure 7:
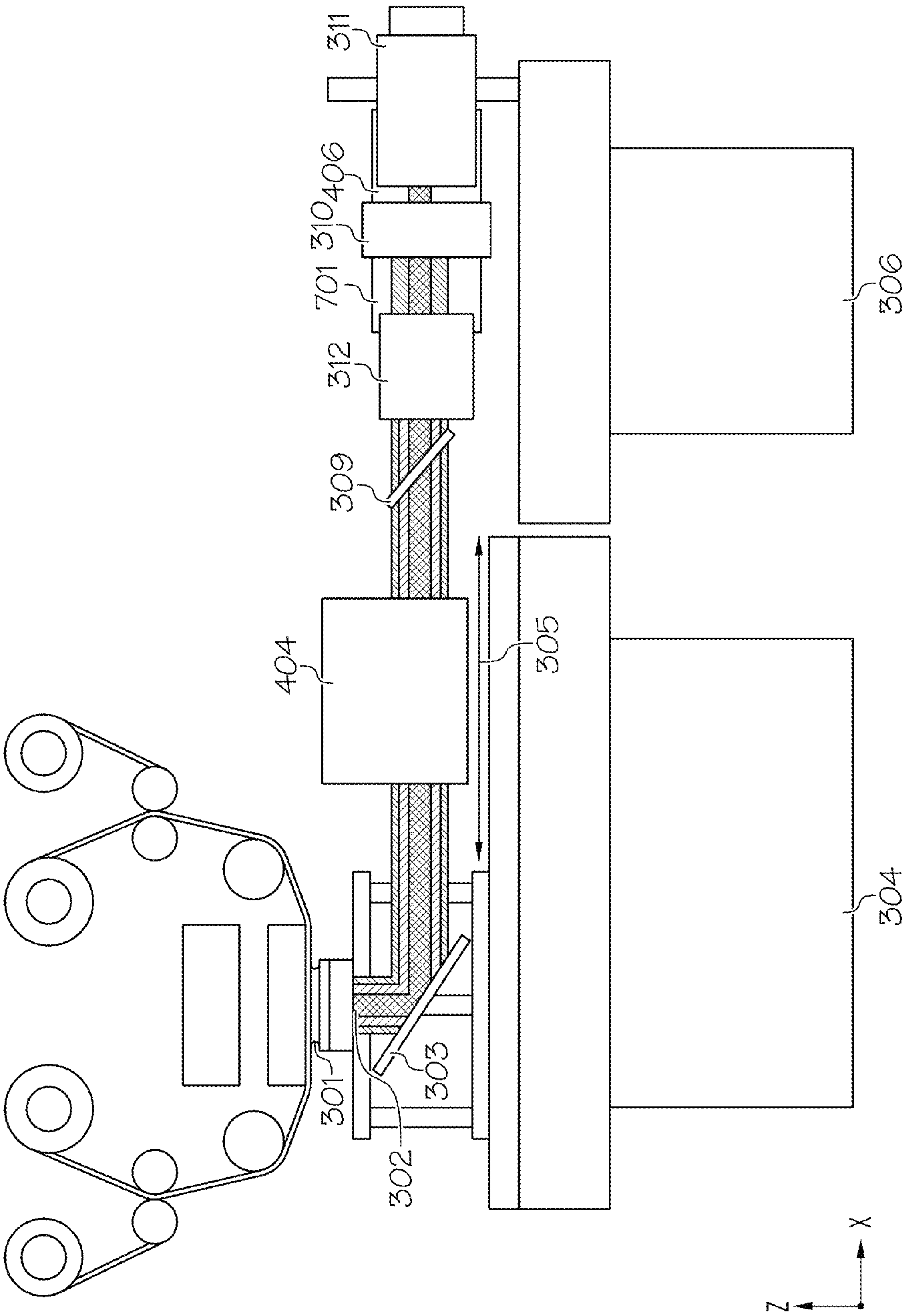
FIG. 7 illustrates an alternate architecture showing the μP module with respect to the nP3 module in the side view in accordance with an embodiment of the present disclosure.

FIG. 7 illustrates an alternate architecture showing the µP module with respect to the nP3 module in the side view in accordance with an embodiment of the present disclosure. As illustrated in FIG. 7, such an embodiment has many of the same components as shown in FIGS. 3 and 4 as well as additional mirror 701.

Figure 8:
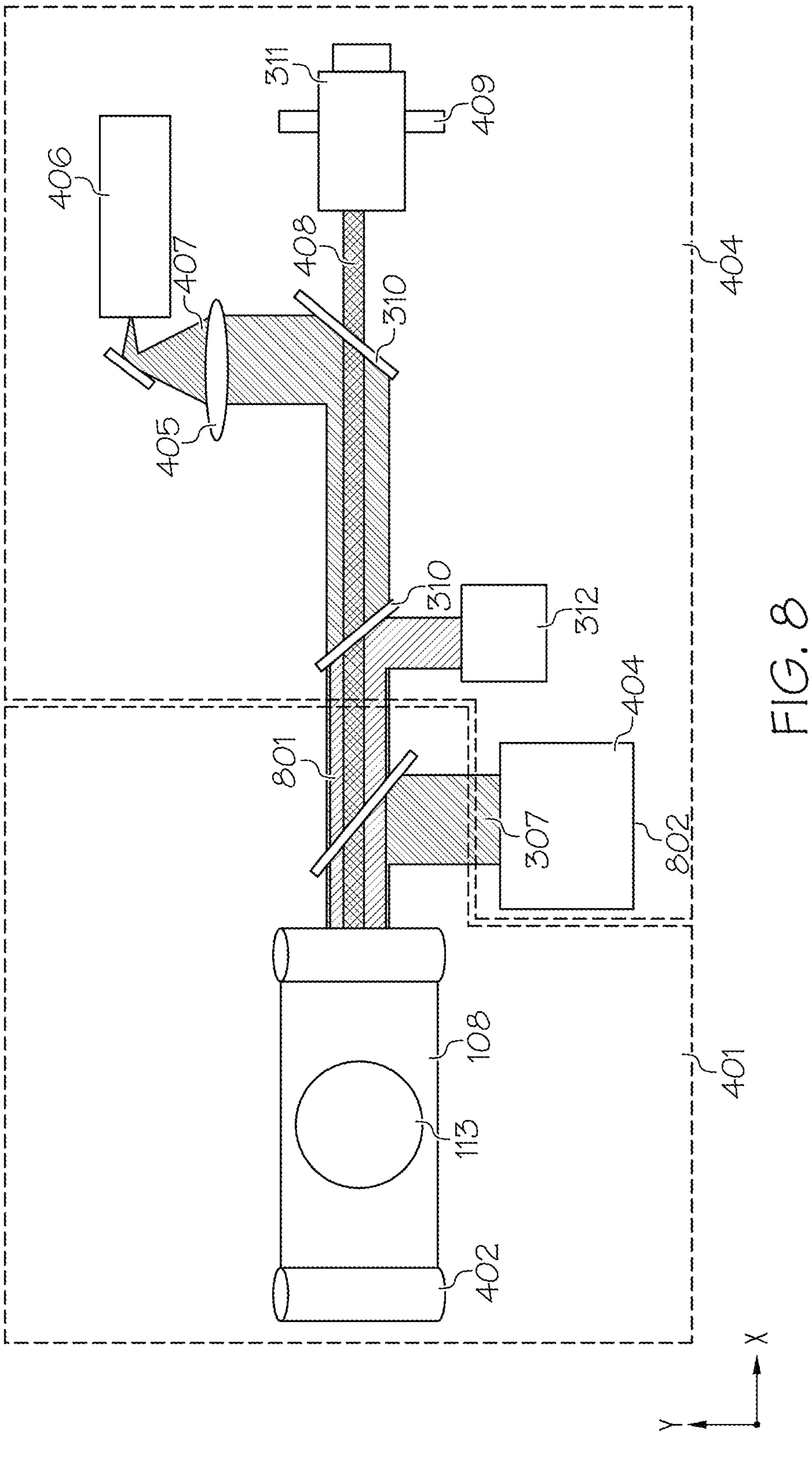
FIG. 8 illustrates an alternate architecture showing the μP module with respect to the nP3 module in the top view in accordance with an embodiment of the present disclosure.

FIG. 8 illustrates an alternate architecture showing the µP module with respect to the nP3 module in the top view in accordance with an embodiment of the present disclosure. As illustrated in FIG. 8, such an embodiment has many of the same components as shown in FIGS. 3 and 4 as well as illustrates a large area beam splitter 801 and an alternate location 802 in front of the nP3 module (nP3 station 401) for the telephoto lens and RGB camera 404.

A description regarding these Figures, FIGS. 7 and 8, is provided below.

FIGS. 7 and 8 illustrate an alternative architecture to reduce the working distance between the film stack (e.g., film stack 301) and the TFM imaging system. The telephoto lens (see telephoto lens and RGB camera 404) is located on the nP3 station 401 as shown in FIG. 8. A large area beam splitter 801 is directly upstream of the telephoto lens (see telephoto lens and RGB camera 404) which directs the reflected light (see element 307) from the film stack (e.g., film stack 301) to the TFM imaging system. This architecture ensures high resolution TFM through a reduced working distance and real-time TFM operations. It is noted that this architecture protrudes on the operator side of the apparatus (along-y axis) thereby increasing the size of the machine significantly.

Figure 9B:
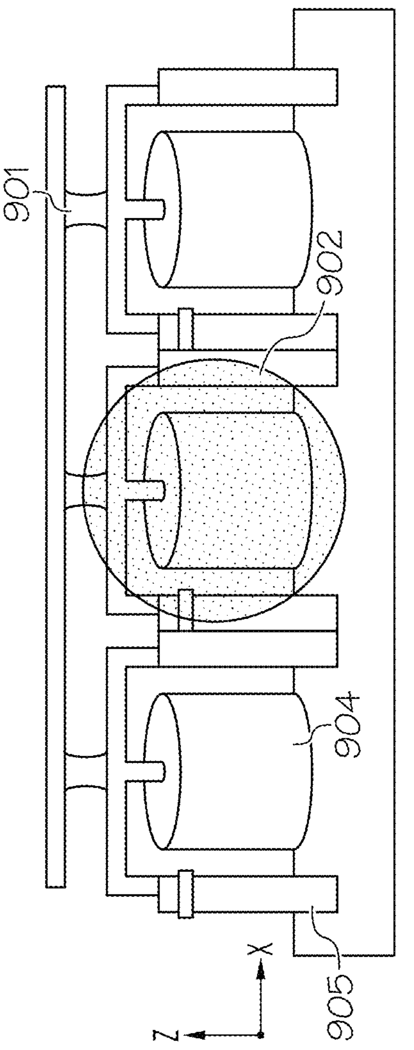
FIGS. 9A-9C illustrate the optical path from the μP module to the nP3 module showing the incident beam on the film stack in accordance with an embodiment of the present disclosure.
Figure 9C:
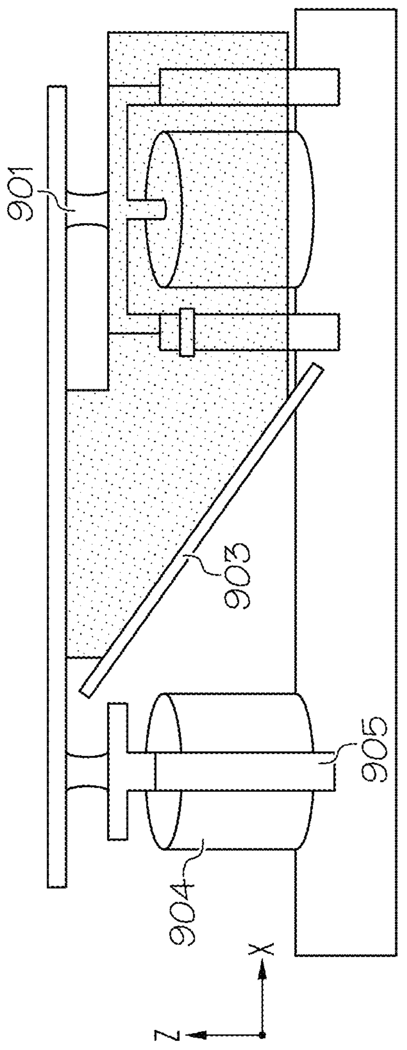
Figure 9A:
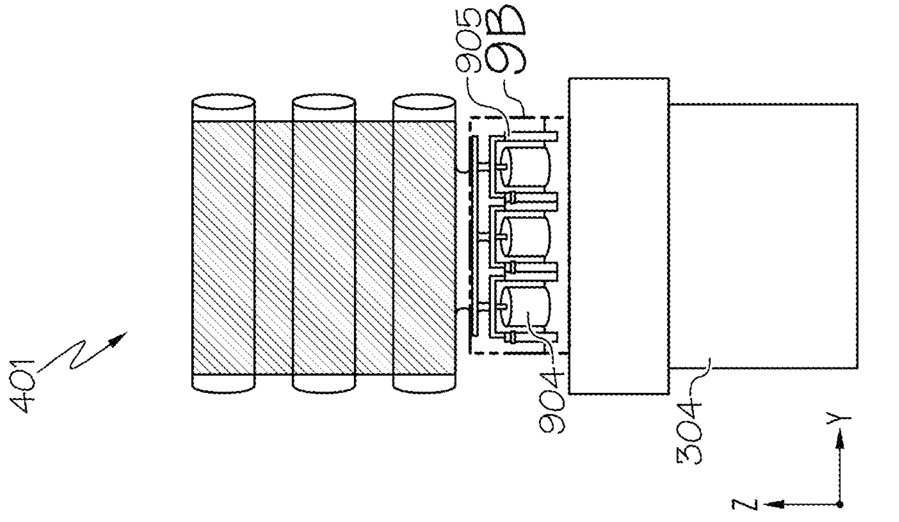

Referring now to FIGS. 9A-9C, FIGS. 9A-9C illustrate the optical path from the µP module to the nP3 module showing the incident beam on the film stack in accordance with an embodiment of the present disclosure. In particular, FIG. 9A illustrates the side view of the nP3 module (nP3 station 401). FIG. 9B illustrates a cross-section of the vertical-tip-tilt stage (see element 115 of FIG. 1) in accordance with an embodiment of the present disclosure. Furthermore, FIG. 9C illustrates an alternative cross-section of the vertical-tip-tilt stage (see element 115 of FIG. 1) in accordance with an embodiment of the present disclosure.

As shown in FIG. 9B, FIG. 9B illustrates the vertical-tip-tilt stage (see element 115 of FIG. 1) with a substrate payload (collectively identified as element 901). Furthermore, FIG. 9B illustrates the beam direction along the X-axis (see element 902), which is incident on the film stack (e.g., film stack 301) from the substrate side.

As shown in FIG. 9C, there is a mirror 903 mounted at a 45 degree angle to direct the incident beam (discussed above) along the Z-axis.

Referring to FIGS. 9A-9C, a side view of the vertical-tip-tilt stage (see element 115 of FIG. 1) used for mounting the substrate (e.g., substrate 113) and the film stack (e.g., film stack 301) is shown. The zoomed-in view shows 3 voice coil driven motors 904 on flexure bearings 905. In one embodiment, these motors 904 are located on the corners of an equilateral triangle. In one embodiment, the edge of the triangle and the central region provide space for the light beams from the µP module (e.g., µP station 404) to be incident on the film stack (e.g., film stack 301). In one embodiment, a flat mirror (e.g., mirror 303) is mounted at 45 degrees to direct horizontal light beams (along −X axis) vertically upwards (along +Z axis) as shown in FIG. 9C.

Figure 10:
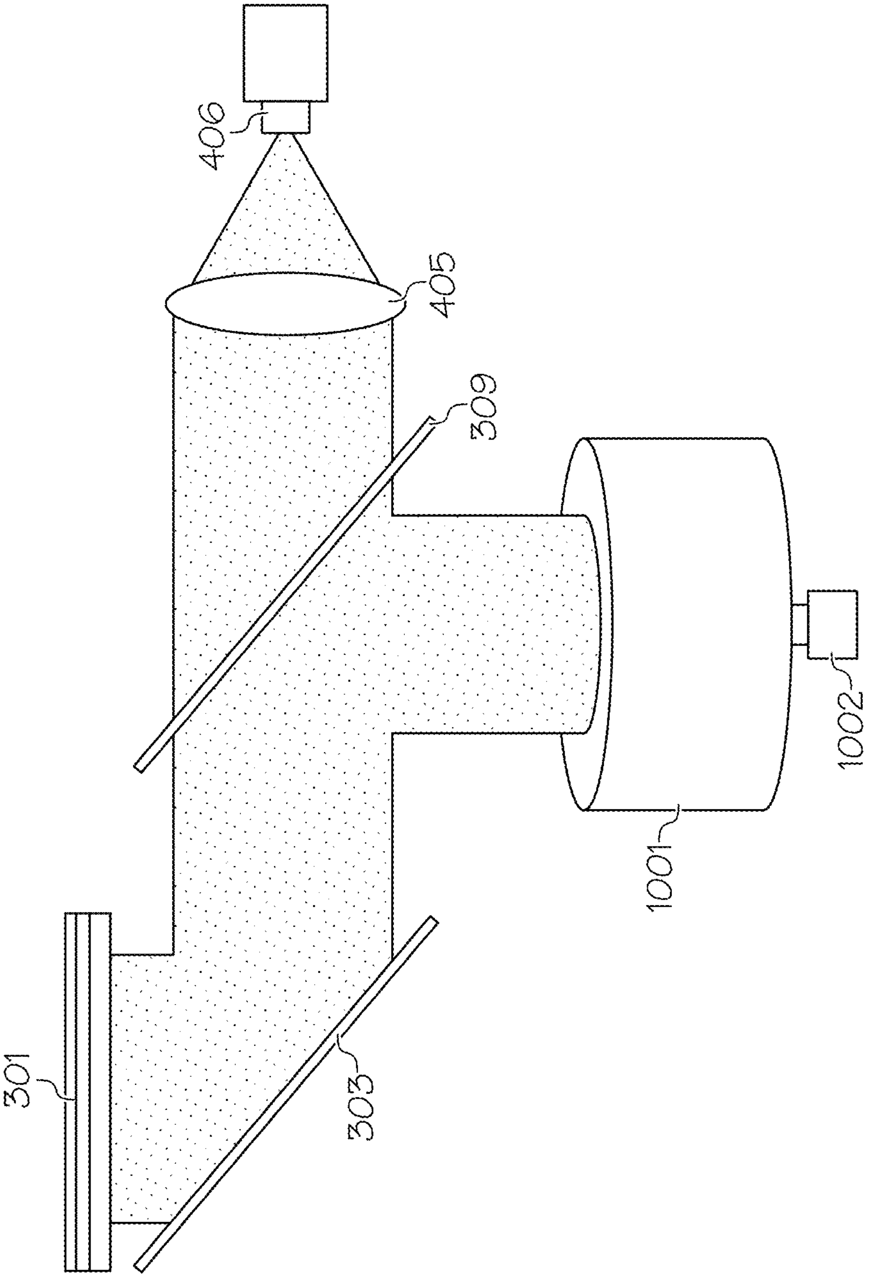
FIG. 10 illustrates a thin film metrology subsystem in accordance with an embodiment of the present disclosure.

FIG. 10 illustrates a thin film metrology subsystem in accordance with an embodiment of the present disclosure.

As shown in FIG. 10, the thin film metrology subsystem includes a light source 406, achromatic lens 405, beam splitter 309, mirror 303 and film stack 301. Additionally, the thin film metrology subsystem includes a telecentric lens 1001 and an image sensor 1002.

In one embodiment, light source 406 is a broadband lamp, multi-wavelength light emitting diodes (LEDs), monochromator, etc. Achromatic lens 405 is used to collimate this divergent light source. The lens selection and placement is dependent on the required beam diameter. The reflected beam from film stack 301 is directed to the telephoto lens via a beam splitter 309. In one embodiment, apart from thin film metrology, an optical profilometry, such as with a Zygo three-dimensional (3D) surface optical profiler, is used to determine the curvature of the top face of the cured resist (e.g., resist 112).

The following is a table (Table 2) illustrating the exemplary telecentric lenses used in thin film metrology.

TABLE 2

| Model | Working Distance (mm) | Depth of Field (mm) | Field-of-View (mm) | Max. Sensor Size |
|---|---|---|---|---|
| Edmund Optics 34-008 | 374 | 384 | ~194 × 150 | ⅔" |
| Opto-e TC2MHR240-F | 500 | 400 | ~192 × 144 | 1" |
| Opto-e TC13192 | 526 | 1050 | ~192 × 144 | ⅓" |
| Opto-e TC12192 | 526 | 603 | ~194 × 145 | ½" |
| Opto-e ultra HD (4k, 8k, etc.) | 500 | 25 | ~200 × 200 | <57 mm |

Figure 11:
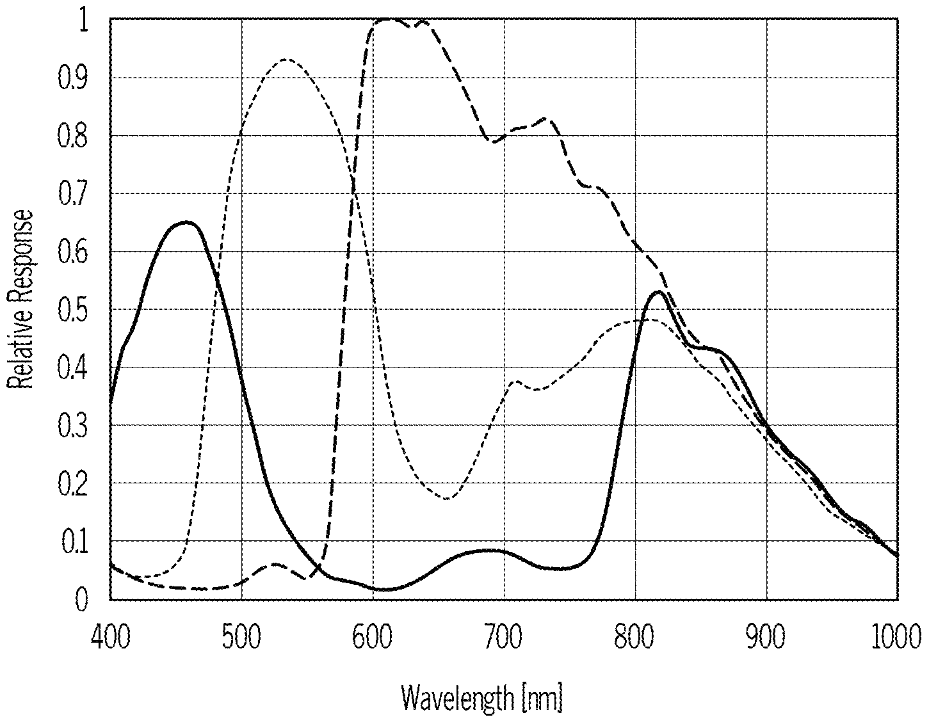
FIG. 11 is a graph depicting the sensitivity of an exemplary thin film metrology image sensor in accordance with an embodiment of the present disclosure.

Referring now to FIG. 11, FIG. 11 is a graph depicting the sensitivity of an exemplary thin film metrology image sensor (RGB image sensor) (e.g., Sony IMX264LLR) in accordance with an embodiment of the present disclosure. In particular, FIG. 11 is a graph of the relative response versus wavelength (nm). The sensitivity spectra of a photodiode is given by its quantum efficiency. The light collected at each R, G and B photodiode is a convolution of the QE curves with the emission spectra of the light source. These R, G and B values for each pixel are used to calculate the film thickness at that given pixel.

Figure 12A:
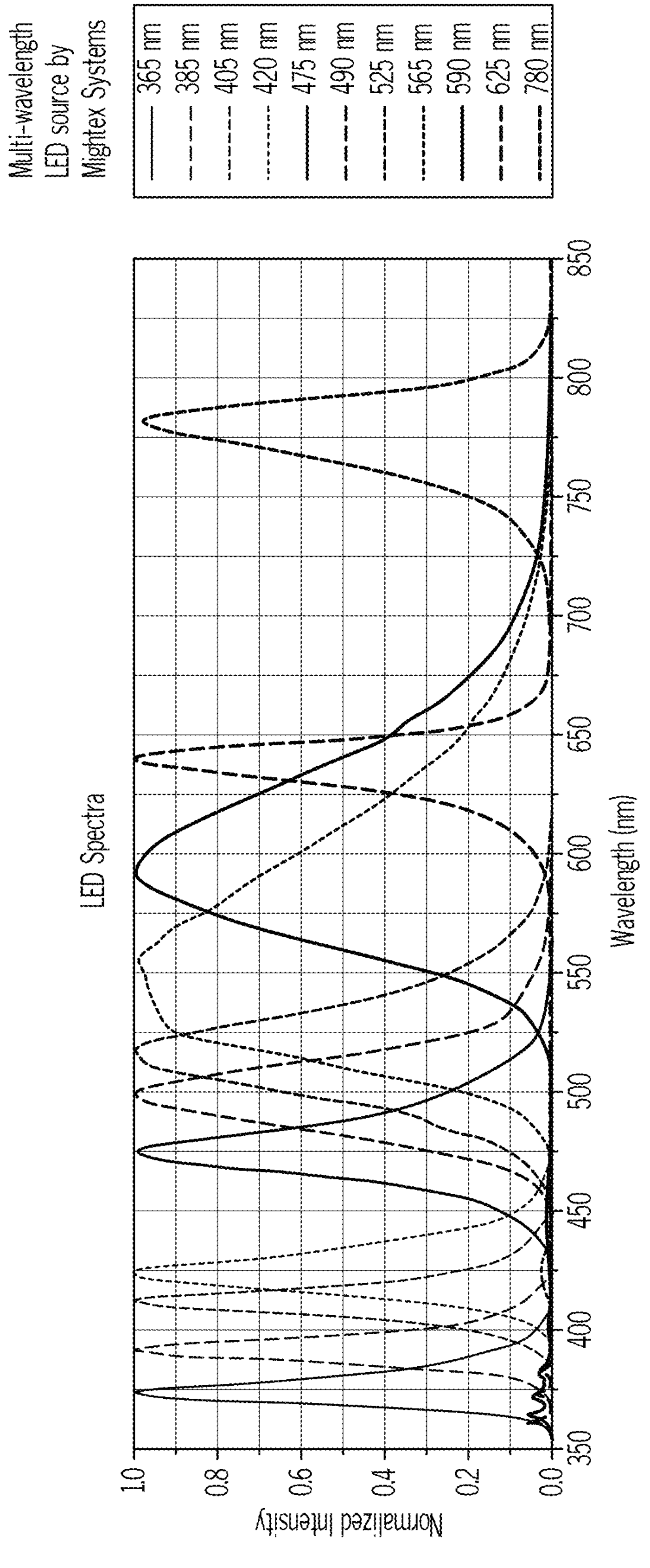
FIGS. 12A-12C illustrate the light sources for thin film metrology in accordance with an embodiment of the present disclosure.
Figure 12C:
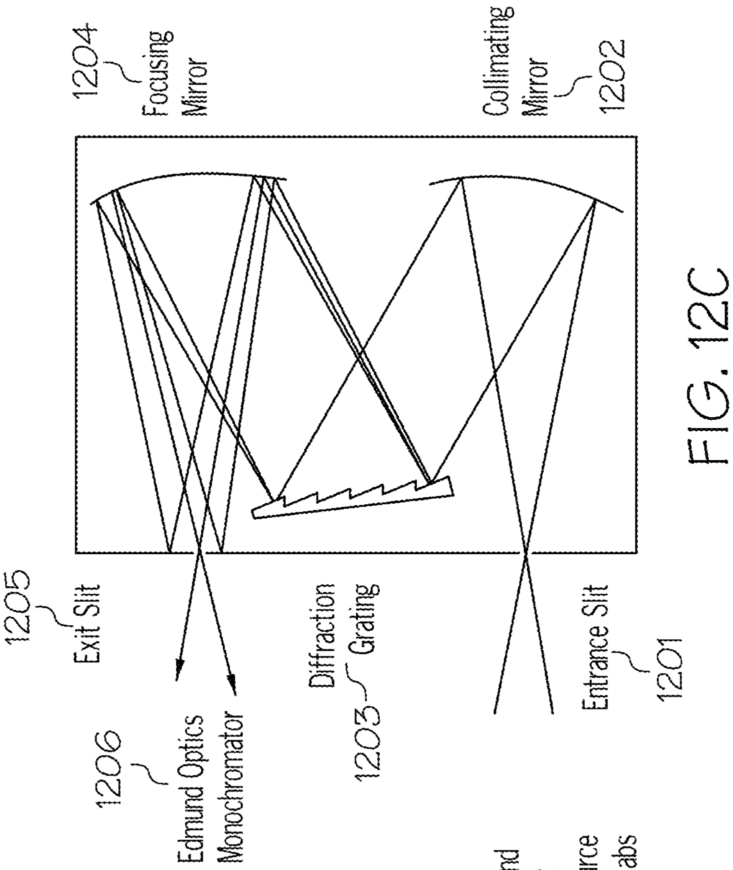
Figure 12B:
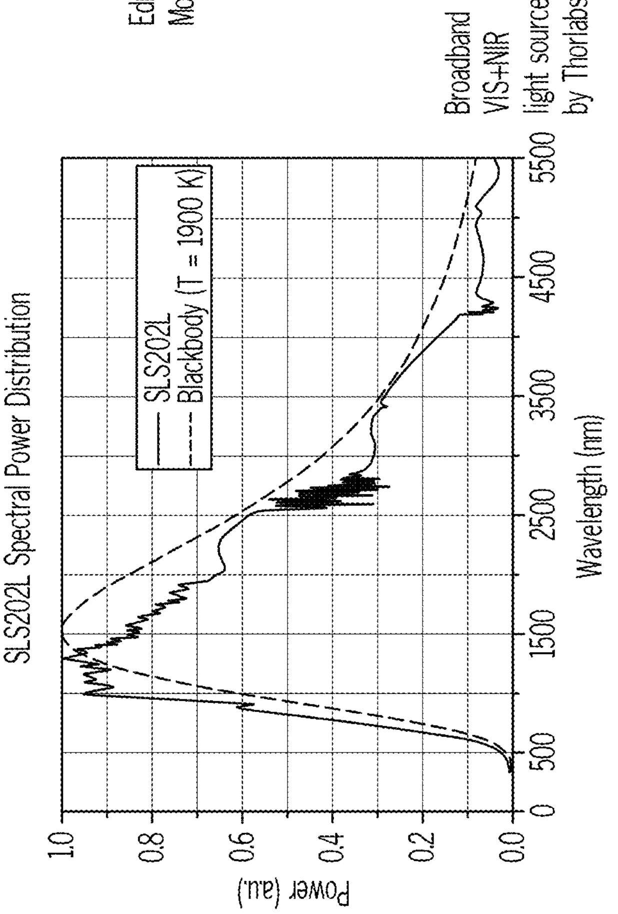

Referring now to FIGS. 12A-12C, FIGS. 12A-12C illustrate the light sources for thin film metrology in accordance with an embodiment of the present disclosure. In particular, FIG. 12A illustrates the normalized intensity per wavelength for various LED spectra. FIG. 12B illustrates the power and spectral power distribution per wavelength for broadband visible and near-infrared light sources. FIG. 12C illustrates the light source of a monochromator (e.g., Edmund Optics® monochromator) where light enters an entrance site 1201, reflected off a collimating mirror 1202 which narrows the beam of light waves towards a diffraction grating 1203 which diffracts the light into several beams towards a focusing mirror 1204, which focuses the light beam to exit slit 1205 towards a monochromator 1206 (e.g., Edmund Optics® monochromator).

Referring again to FIGS. 12A-12C, exemplary light sources for TFM are shown. For example, a multi-wavelength LED source from Mightex Systems with the narrow band emission spectra of each LED is shown in FIG. 12A. These LEDs can be individually controlled and precisely synchronized with the image sensor shutter to enable collection of high-resolution large area RGB images sequentially at the maximum FPS of the camera. A broadband light source is shown that has an emission spectrum in the visible to mid-IR in FIG. 12B. A monochromator (e.g., monochromator 1206) can also be used for atline TFM where individual wavelengths in the spectrum can be used to recreate a reflection spectra. The film interference reflection spectra produced by a monochromator (e.g., monochromator 1206) is a precise method, but its low throughput prohibits real-time TFM.

Figure 13A:
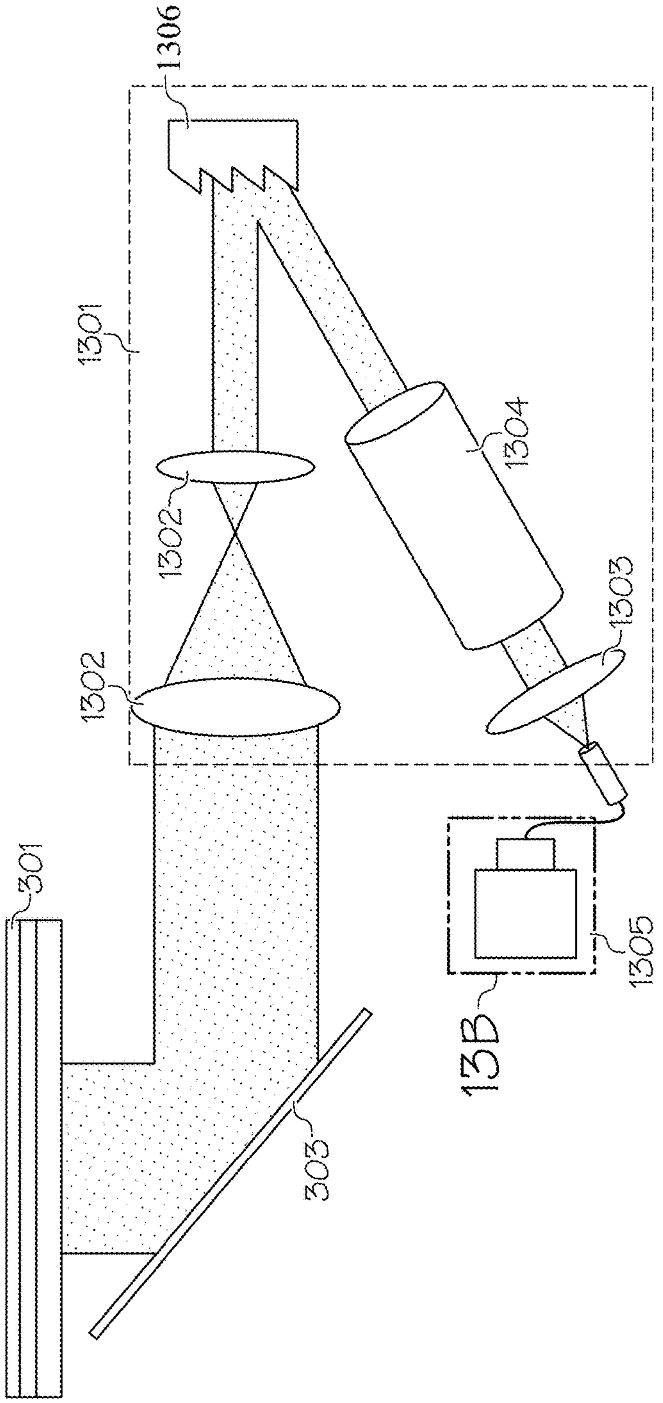
FIGS. 13A-13B illustrate a thermal actuation subsystem in accordance with an embodiment of the present disclosure.
Figure 13B:
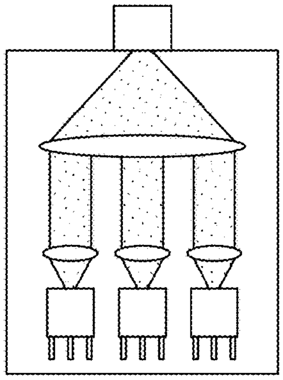

FIGS. 13A-13B illustrate a thermal actuation subsystem in accordance with an embodiment of the present disclosure.

Referring to FIG. 13A, FIG. 13A illustrates a section mounted on XY stage 1301, which includes telescoping lenses 1302, an aspheric lens 1303, a beam shaping system 1304 and DMD components 1306. FIG. 13B illustrates diode laser accumulation 1305.

Referring again to FIGS. 13A-13B, light from multiple laser diodes (see element 1305) are collimated using aspheric lens 1303 and focused into a fiber optic cable. In one embodiment, the wavelength of the laser diodes is chosen to be either in the visible wavelength range or SWIR (short-wave infrared) to enable near complete absorption in film stack 301. The number of laser diodes used is dependent on the heat intensity required and the area of projection. The light emitted from the fiber optic cable is again collimated using aspheric lens 1303. It is followed by beam shaping via beam shaping system 1304 which involves flattening the intensity profile across the beam diameter from an initial Gaussian profile. Once the beam is collimated and shaped, it is incident on digital micromirror device (DMD) components 1306. In one embodiment, DMD components 1306 have a full high-definition (HD) resolution (1920×1080 micro-mirrors) that can be individually controlled. In one embodiment, DMD components 1306 are programmed to project the desired intensity profile on film stack 301. This leads to a local temperature distribution on film stack 301. While locally heating an area of 10×10 mm on a larger film stack (for example, 6 in. wafer), an individual micromirror has lateral control over a 10 μm pixel size on the substrate (e.g., substrate 113). Similarly, pixel sizes on the substrate (e.g., substrate 113) can be changed to 50 μm or 100 μm depending on the area of projection. In one embodiment, a telescoping lens system (see telescoping lenses 1302) is used to modify the area of projection. A thermal load defined as a two-dimensional (2D) heat intensity profile for a specific duration can be applied on film stack 301 by this subsystem. This thermal load is calculated based on a three-dimensional (3D) thermo-capillary model which predicts thin film flow under a non-uniform heat input as applied by a micromirror array. When a spatially varying (2D) temperature difference is created on the liquid film surface, the surface tension of the liquid changes with respect to temperature. Regions of low temperature have an increased surface tension thereby pulling liquid from nearby regions and regions of higher temperature have a lower surface tension thereby pushing liquid out to nearby regions. The thermo-capillary phenomenon is exploited to obtain precise film evolution in a predetermined duration. This thermal actuation system can operate at a frequency in the kHz range which is more than sufficient to enable high bandwidth real-time actuation. It is noted that the micromirror device (DMD components 1306) can be replaced with a simple collimated laser beam and a modifiable spot size for applications which require flattening of the thin film profile with preexisting peaks and valleys.

Referring now to FIGS. 14A-14D, FIGS. 14A-14D illustrate film stacks (e.g., film stack 301) with a superstrate (e.g., superstrate 108) used for nP3 to accommodate μP in accordance with an embodiment of the present disclosure.

Figure 14A:
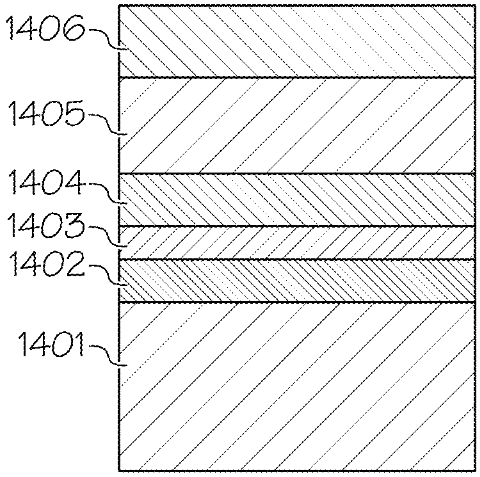
FIGS. 14A-14D illustrate film stacks with a superstrate used for nP3 to accommodate μP in accordance with an embodiment of the present disclosure.

In particular, FIG. 14A illustrates a film stack with a layer of silicon dioxide ($SiO_2$) 1401 and a layer of amorphous Si (aSi) 1402 on top of $SiO_2$ 1401 along with a layer of resist 1403 on top of aSi 1402, a layer of gold (Au) 1404 on top of resist 1403, a layer of polycarbonate (PC) 1405 on top of Au 1404, and a layer of an interleaf film 1406 on top of PC 1405.

Figure 14B:
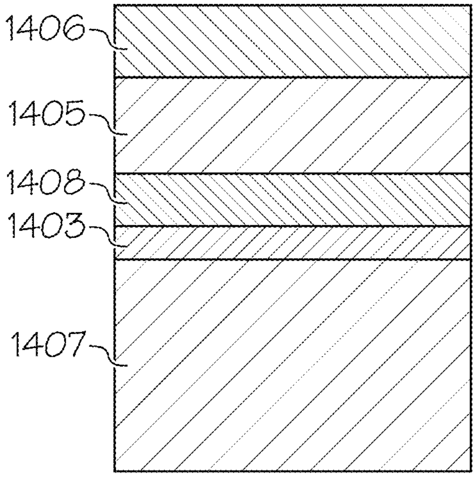

FIG. 14B illustrates a film stack with a layer of silicon (Si) 1407 and a layer of resist 1403 on top of silicon 1407 along with a layer of $SiO_2$ or gold (Au) 1408 on top of resist 1403, a layer of polycarbonate (PC) 1405 on top of layer 1408, and a layer of an interleaf film 1406 on top of PC 1405.

Figure 14C:
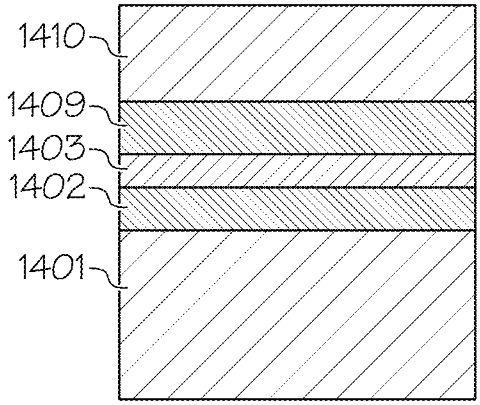

FIG. 14C illustrates a film stack with a layer of silicon dioxide ($SiO_2$) 1401 and a layer of aSi 1402 on top of $SiO_2$ 1401 along with a layer of resist 1403 on top of aSi 1402, a layer of aSi/titanium (Ti) 1409 on top of resist 1403, and a layer of PC/$SiO_2$ 1410 on top of aSi/Ti 1409. In one embodiment, the thickness of aSi 1402 is approximately 5 nm. In one embodiment, the thickness of aSi/Ti is less than 100 nm.

Figure 14D:
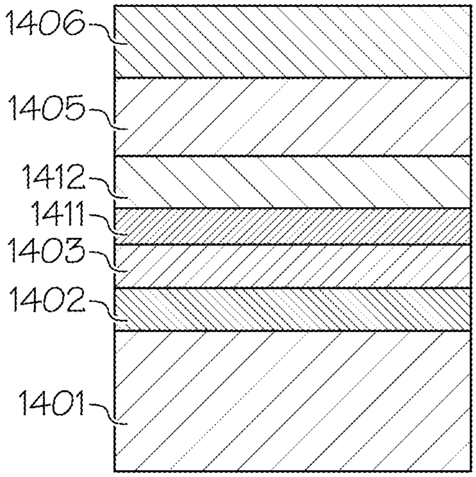

FIG. 14D illustrates a film stack with a layer of silicon dioxide ($SiO_2$) 1401 and a layer of aSi 1402 on top of $SiO_2$ 1401 along with a layer of resist 1403 on top of aSi 1402, a layer of dichroic film 1411 on top of resist 1403, a layer of silver (Ag)/cobalt (Co) nanoparticles (NPs) 1412 on top of dichroic film 1411, a layer of polycarbonate (PC) 1405 on top of layer 1412, and a layer of an interleaf film 1406 on top of PC 1405.

FIGS. 14A-14D describe some film stacks that can be used with the various instances of the apparatus. All these film stacks can allow real-time inline TFM, thermal actuation and UV curing. In the film stack of FIG. 14A, the superstrate (e.g., superstrate 108) is a polycarbonate web (see, e.g., PC 1405) with an interleaf film (e.g., interleaf film 1406) on top. The interleaf film (e.g., interleaf film 1406) provides protection from the particle. The bottom layer of the polycarbonate (e.g., PC 1405) makes contact with the resist (e.g., resist 1403), which is coated with a 5 nm Au film (e.g., Au 1404). This Au thin film (e.g., Au 1404) produces a refractive index change between the superstrate (e.g., PC 1405 and interleaf film 1406) and the resist (e.g., resist 1403)

thereby allowing reflection from this interface. This reflection is crucial to enable thin film interference. Fused silica (e.g., $SiO_2$ 1401) coated with 10 nm of amorphous silicon (aSi) (e.g., aSi 1402) is used as the substrate. Amorphous silicon can be coated using various vacuum deposition techniques, such as sputtering, low pressure chemical vapor deposition (LPCVD), etc. The aSi thin film (e.g., aSi 1402) produces a contrast at the resist-$SiO_2$ interface which is crucial for thin film interference. Hence, this film stack allows film measurement via thin film interference in the visible and near IR range. For an exemplar SWIR wavelength of 2.3 μm, polycarbonate (e.g., PC 1405) is absorptive and the remaining materials in the film stack are transparent. This wavelength is used in the thermal actuation system to apply the thermal load at the PC-resist interface. The light beam from the thermal actuation subsystem is incident on the film stack from the $SiO_2$ substrate side (see, e.g., $SiO_2$ 1401). The interleaf film (e.g., interleaf film 1406), PC (e.g., PC 1405) and thin film Au (e.g., Au 1404) are all transparent in the UV wavelength. This enables UV curing of the liquid resist film (e.g., resist 1403) from the substrate and superstrate side both. In summary, the film stack of FIG. 14A enables real-time and atline thin film interference in the visible and NIR wavelength range, thermal actuation for a 2.3 μm wavelength and UV curing.

In the film stack of FIG. 14B, the superstrate (e.g., superstrate 108) is a polycarbonate web (e.g., PC 1405) with an interleaf film (e.g., interleaf film 1406) on top. The bottom layer of the PC web (e.g., PC 1405) can be coated with Au (see layer 1408) for real-time and atline film thickness measurement or it can be coated with $SiO_2$ (see layer 1408) if only atline film thickness measurement is performed. The substrate is silicon (e.g., silicon 1407). The superstrate (e.g., PC 1405 and interleaf film 1406) is visible to UV wavelengths. Using an Au thin film (e.g., Au layer 1408) on the superstrate produces a refractive index mismatch at the PC (e.g., PC 1405) and resist (e.g., resist 1403) interface which is crucial for thin film interference. Silicon (e.g., silicon 1407) is transparent in NIR wavelengths, therefore, real-time film thickness measurements can be performed with NIR spectrum wavelengths. Since silicon (e.g., silicon 1407) is also transparent to short-wave IR, only PC (e.g., PC 1405) absorbs SWIR upon irradiation from the substrate side. In summary, the film stack of FIG. 14B enables real-time thin film interference in the NIR wavelengths and atline thin film interference in the visible and NIR wavelength range, thermal actuation for a 2.3 μm wavelength and UV curing.

In the film stack of FIG. 14C, the superstrate (e.g., superstrate 108) is a fused silica wafer or a PC substrate (see, e.g., PC/$SiO_2$ 1410). In one embodiment, the superstrate is coated with a Ti or aSi film (e.g., aSi/Ti 1409) (>100 nm). The Ti or aSi film (e.g., film 1409) produces a refractive index mismatch at the interface of the superstrate and resist (e.g., resist 1403) enabling thin film interference in the visible and NIR range. Since only ~50% of the light is reflected from the superstrate-resist interface, the remaining light is absorbed in the Ti or aSi film (e.g., film 1409). Thus, visible wavelengths can be used to heat up the superstrate (e.g., PC/$SiO_2$ 1410). It is noted that the superstrate (e.g., PC/$SiO_2$ 1410) is not UV transparent in this case. The substrate is a fused silica wafer (e.g., $SiO_2$ 1401) with an aSi thin film (e.g., aSi 1402). The substrate (e.g., $SiO_2$ 1401 and aSi 1402) is UV transparent allowing UV curing of the resist (e.g., resist 1403) from the bottom. The substrate (e.g., $SiO_2$ 1401 and aSi 1402) also has a refractive index mismatch with the resist (e.g., resist 1403) allowing both real-time and atline thin film interference. The substrate (e.g., $SiO_2$ 1401 and aSi 1402) is also highly transparent to visible wavelengths allowing heating of the superstrate (e.g., PC/$SiO_2$ 1410) with visible photons being irradiated from the substrate side.

In the film stack of FIG. 14D, the superstrate (e.g., superstrate 108) consists of a PC web (e.g., PC 1405) with an interleaf film (e.g., interleaf film 1406). A nanoparticles layer (e.g., layer 1412) is deposited on the superstrate (objects between 1-100 nm adhering to the substrate) via deposition processes, such as slot die coating, kiss gravure coating, etc. to enhance narrowband light absorption. For instance, Ag nanoparticles enhance absorption in the 400-450 nm range and are transparent in the rest of the spectrum. A layer of dichroic film (e.g., dichroic film 1411) is also deposited on the superstrate (e.g., PC 1405 and interleaf film 1406) to enable transmission in a given band and reflection in another band. For example, dichroic films with a cutoff wavelength of 450 nm enable transmission from 325 nm to 430 nm and reflection from 470 to 700 nm. This makes the superstrate (e.g., PC 1405 and interleaf film 1406) transparent in UV with a narrowband visible range allowing real-time thin film interference from 470-700 nm and superstrate absorption between 400-450 nm. The substrate is fused silica (e.g., $SiO_2$ 1401) with a layer of aSi (e.g., aSi 1402) to add a contrast at the resist-$SiO_2$ interface. In summary, the film stack of FIG. 14D allows UV curing from both the substrate and superstrate side, thermal actuation of the superstrate from the substrate side in the wavelength range of 400-450 nm, and real-time thin film interference in the range of 470-700 nm.

Figure 15A:
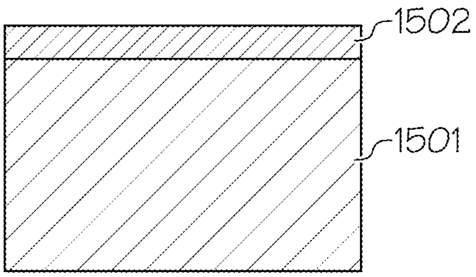
FIGS. 15A-15B illustrate film stacks without the superstrate used for nP3 to accommodate μP in accordance with an embodiment of the present disclosure.
Figure 15B:
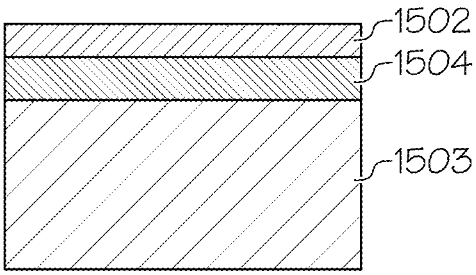

FIGS. 15A-15B illustrate film stacks without the superstrate used for nP3 to accommodate μP in accordance with an embodiment of the present disclosure.

Referring to FIG. 15A, the film stack of FIG. 15A includes a layer of silicon (Si) 1501 with a layer of resist 1502 residing on silicon 1501.

Referring to FIG. 15B, the film stack of FIG. 15B includes a layer of $SiO_2$ 1503 with a layer of amorphous silicon (aSi) 1504 residing on $SiO_2$ 1503 as well as a layer of resist 1502 residing on aSi 1504. In one embodiment, the thickness of aSi 1504 is approximately 5 nm.

The film stacks of FIGS. 15A-15B illustrate film stacks used for atline thin film measurements. Once the superstrate is removed the resist cured, the film stack remains as shown. In the film stack of FIG. 15A, a contrast in refractive index between the Si substrate (e.g., Si 1501), resist film (e.g., resist 1502) and the medium (typically air or vacuum or inert gas) allows thin film interference and atline film thickness measurement of the resist film (e.g., resist 1502). In the film stack of 15B, the substrate is a fused silica wafer (e.g., $SiO_2$ 1503) with an aSi film (e.g., aSi 1504). A contrast in refractive index between the aSi film (e.g., aSi 1504), resist (e.g., resist 1502) and medium enables thin film interference and atline film thickness measurement of resist film (e.g., resist 1502). It is noted that the resist (e.g., resist 1502) is cured and no thermal actuation of UV irradiation is performed on these film stacks.

Figure 16A:
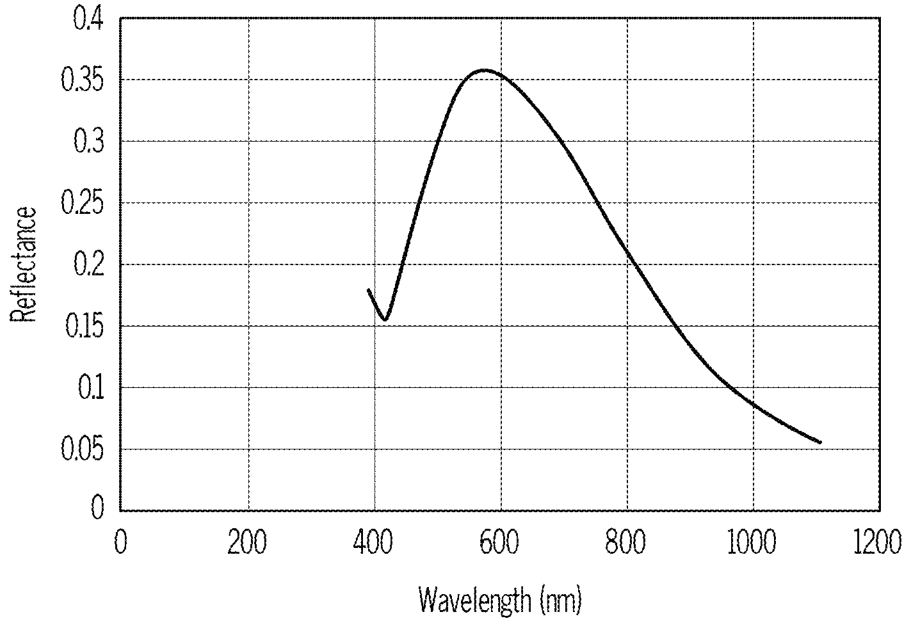
FIGS. 16A-16B illustrate reflection spectra based on thin film interference for a film stack with a silicon substrate and imprint resist film in accordance with an embodiment of the present disclosure.
Figure 16B:
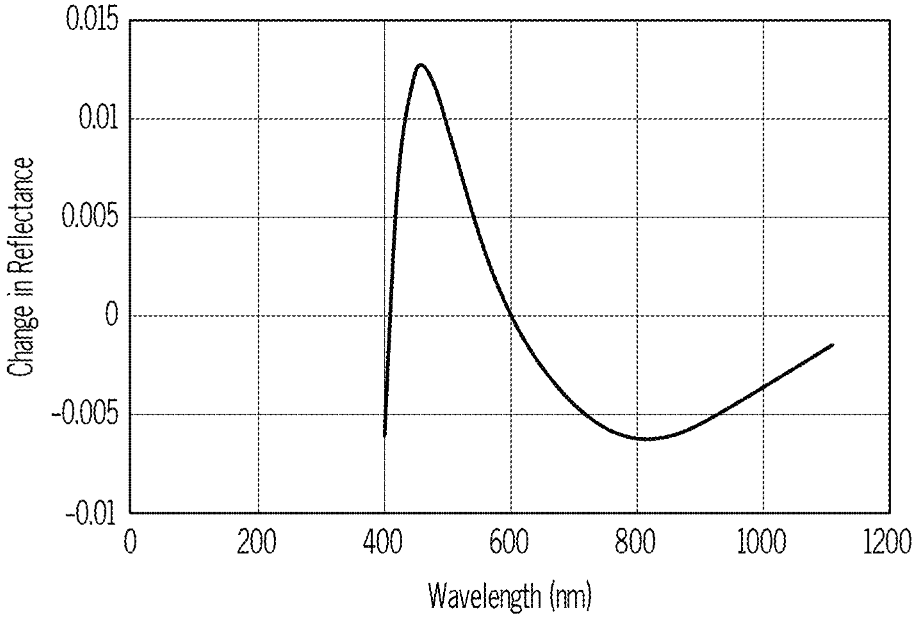

Referring now to FIGS. 16A-16B, FIGS. 16A-16B illustrate reflection spectra based on thin film interference for a film stack with a silicon substrate and imprint resist film in accordance with an embodiment of the present disclosure.

In particular, FIG. 16A illustrates the reflectance per wavelength (nm) for a 200 nm resist. FIG. 16B illustrates the change in reflectance for a 2 nm change in resist thickness.

Figure 17A:
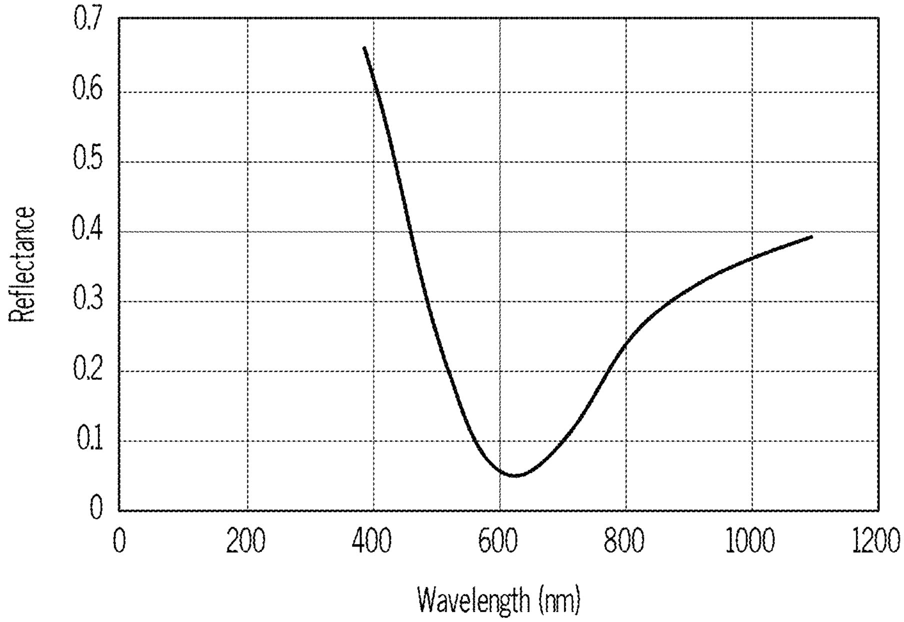
FIGS. 17A-17B illustrate reflection spectra based on the thin film interference for a film stack with a fused silica substrate with an a-Si film, an imprint resist film and a PET superstrate with an Au film in accordance with an embodiment of the present disclosure.
Figure 17B:
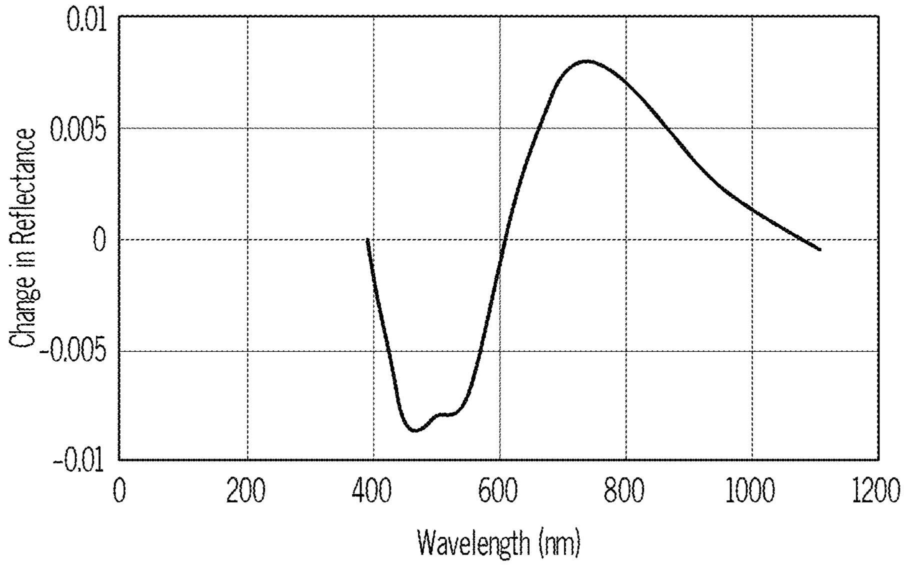

FIGS. 17A-17B illustrate reflection spectra based on the thin film interference for a film stack with a fused silica substrate with an a-Si film, an imprint resist film and a PET superstrate with an Au film in accordance with an embodiment of the present disclosure.

In particular, FIG. 17A illustrates the reflectance per wavelength (nm) for a 200 nm resist. FIG. 17B illustrates the change in reflectance for a 2 nm change in resist thickness.

Figure 18A:
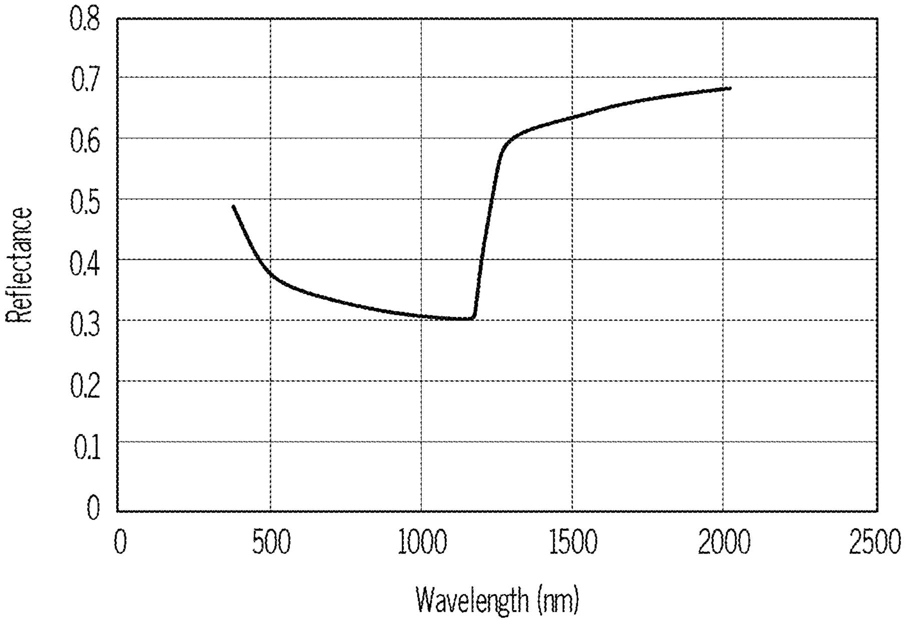
FIGS. 18A-18B illustrate near-IR reflection spectra based on the thin film interference for a film stack with a silicon substrate, an imprint resist film and a PET superstrate with an Au film in accordance with an embodiment of the present disclosure.
Figure 18B:
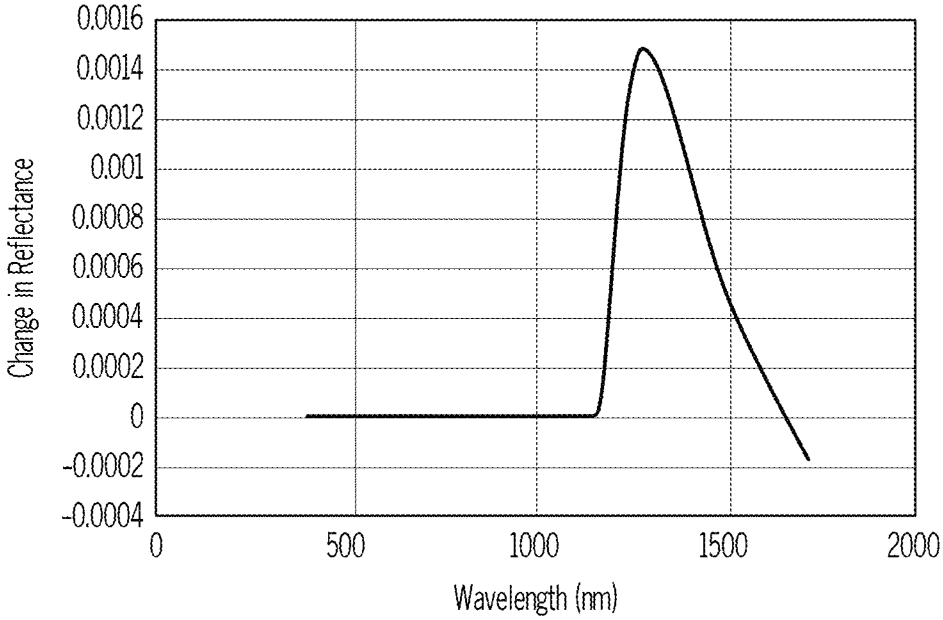

FIGS. 18A-18B illustrate near-IR reflection spectra based on the thin film interference for a film stack with a silicon substrate, an imprint resist film and a PET superstrate with an Au film in accordance with an embodiment of the present disclosure.

In particular, FIG. 18A illustrates the reflectance per wavelength (nm) for a 200 nm resist. FIG. 18B illustrates the change in reflectance for a 2 nm change in resist thickness.

Referring to FIGS. 16A-16B, 17A-17B and 18A-18B, such Figures plot the reflection spectra obtained via thin film interference from the aforementioned film stacks. Difference in reflectance is also plotted for a film thickness change of 2 nm from an exemplary film thickness of 200 nm. In FIGS. 16A-16B, the film stack is a silicon substrate with resist film and the medium is air. The reflection spectra has a peak at 600 nm. Changing the film thickness by 2 nm produces a change in reflectance spectra by about 1.2%. This indicates that the ambient light noise needs to be significantly lower than 1.2% of the saturation level of the image sensor to be able to measure a 2 nm change in film thickness. Secondly, the dynamic range of the image sensor needs to be greater than 100:1 and ADC resolution should be greater than 8 bits.

In FIGS. 17A-17B, the reflectance spectra and change in reflectance is plotted for a film stack with a fused silica substrate with an aSi film, an imprint resist film and a PET superstrate with an Au film. The reflection spectra has a valley at around 600 nm. Change in reflectance measurement is about 0.8% for a 2 nm change in resist film thickness. Hence, constraints on ambient noise and the dynamic ratio of the image sensor are defined by the change in the reflectance plot.

In FIGS. 18A-18B, the reflectance spectra and change in reflectance is plotted for a film stack with a silicon substrate, an imprint resist film and a PET superstrate with an Au film. It is noted that silicon is opaque to visible wavelength. Thus, only NIR wavelengths are utilized to observe a change in reflectance for a 2 nm change in resist film thickness. The maximum change is 0.14%. Therefore, constraints on ambient noise, dynamic ratio and ADC resolution are higher. Ambient noise needs to be significantly lower than 0.14%, the dynamic ratio needs to be greater than 714:1 and the ADC resolution needs to be higher than 10 bits. These plots are used to design the optical system and optimize the film stack materials.

Etch-back of the cured resist into the fused silica and silicon substrate can be achieved through dry etching in a plasma. Different etch chamber configurations can be used, including capacitively coupled plasma chambers (i.e., a parallel plate configuration), CCP, or inductively coupled plasma chambers, ICP. The etch rates of the resist and substrate (a-Si and $SiO_2$) can be controlled by adjusting the parameters of the etch process. Adjustable etch parameters include the process pressure (1 mTorr-1000 mTorr), gas flow rates (0.1-100 sccm), applied RF power (20 W-400 W), RF frequency (2-100 MHz), substrate temperature (−150° C. to 400° C.), gas chemistry (Ar, $CF_4$, $CHF_3$, $O_2$, $SF_6$, $Cl_2$, HBr, $C_4F_8$, $H_2$, He, $N_2$), and DC bias (5 V-1000 V) across the electrodes. In the ICP etch chamber configuration, the ICP power (20 W-2500 W) is an additional process parameter that can be tuned. In one embodiment, a CCP etch recipe consisting of 50 sccm Ar, 15 sccm $CHF_3$, 5 sccm $CF_4$, 0.1 sccm $O_2$, 110 mTorr, and RF power of 175 W can produce a resist:$SiO_2$ etch selectivity of 0.25. In another embodiment, modulation of the $O_2$ flow rate up to 2 sccm can produce a resist:$SiO_2$ etch selectivity of 4. In general, different combinations of the parameter set can yield etch selectivity, resist:substrate, in the range 0.1 to 20 where resist:substrate <1 leads to pattern amplitude magnification, resist:substrate >1 leads to pattern amplitude reduction, and resist:substrate=1 leads to pattern amplitude replication.

In one embodiment, etch back of cured resist into diamond substrates is achieved through dry etching in a plasma. To achieve better selectivity, one or more intermediate films are coated between the resist and the diamond substrate. This intermediate film stack can include films of Si, $SiO_2$, Al, Ni and W. An embodiment can be a film of $SiO_2$ in between the resist and the diamond substrate with the etch-back divided into a two-step process. The first step would include transferring the profile from the resist onto the $SiO_2$ intermediate film, which can be done using techniques described above. The second step would be transferring the profile from the intermediate film onto the diamond substrate, which can be done in different etch configurations including reactive-ion etching (RIE), inductively coupled plasma etching (ICP), electron cyclotron resonance (ECR) plasma etching and remote microwave plasma etching. One embodiment of the second step using an ECR plasma etcher with an etch recipe consisting of a gas mixture of Ar (6 sccm), $O_2$ (20 sccm) and $SF_6$ (2 sccm) at a pressure of 4 mTorr and a microwave power of 700 W and substrate bias of −125 V produces a $SiO_2$:diamond selectivity of 5. In one embodiment, the etch rates of the diamond substrate are controlled by adjusting the etch parameters. Adjustable etch parameters include pressure (3 mT-10000 mT), flow rates (0.1-000 sccm), bias power (20 W-400 W), substrate temperature (10° C. to 950° C.), and gas chemistry (Ar, $O_2$, $H_2$, $SF_6$, $CF_4$). In ICP, ECR and remote plasma configuration, coil power (100 W-8000 W) is an additional process parameter that can be tuned. In one embodiment, using an ECR plasma etch recipe consisting of 10 sccm Ar, 20 sccm $O_2$ and 2 sccm $SF_6$ with a microwave power of 900 W and DC bias of −125 V produces an etch rate of 26.6 μm/hr. In another embodiment, using an ECR plasma etch recipe consisting of 3 sccm of $O_2$ with a microwave power of 300 W produces an etch rate of 1.8 μm/hr with the DC bias switched off which increases to 5 μm/hr with a DC bias of −600 V.

For single or polycrystalline diamond, a significantly higher etch rate can be achieved using catalyst enabled thermochemical reactions, where the exemplary catalysts are Ni, Pt, or Fe in an atmosphere of water vapor or hydrogen. In one embodiment, Ni is used as a catalyst in ambient water vapor. A contiguous layer of Ni can be coated on a diamond surface. The surface, if it is crystalline diamond, may be chosen to be a particular crystal orientation, such as 100 or 110. This sample when heated to high temperatures of >900° C. in water vapor can lead to catalytic etching of diamond through carbon atom transport. The etch rates are dependent on the annealing temperature, and the following exemplary etch rates can be achieved for the corresponding temperatures: 0.26 μm/min at a temperature of 900° C., 2.3 μm/min at a temperature of 950° C. and 8.7 μm/min at a temperature of 1000° C.

Since the etch rates are dependent on temperature, the diamond substrate may be etched to a desired profile by applying a heat input with one or both of the following features: (i) a two-dimensional (2D) spatially varying heat profile; and (ii) a time varying heat profile. This heat input is applied onto the catalyst coated substrate to generate a related spatial, time varying, temperature profile. An exemplary device generating the aforementioned 2D spatial and/or time varying, heat input is a Digital Micromirror Device (DMD) with a high powered laser. The catalysts, for example, Ni, have high absorptivity for light in the visible region and a laser source with wavelength in this region can be used. To generate the desired 2D spatial time varying temperature profile, the required 2D spatial time varying heat input is calculated based on the thermal diffusivity of the materials and geometry of the film stack. Absorptivity of the laser light also depends on the catalyst film thickness. Hence, the temperature profile can also be influenced by using a uniform light source with modulation in the catalyst film thickness (typically in the range of 1-50 nm). A desired profile of the catalyst is generated using nP3 and etch back. In one embodiment, etching of Ni is performed using plasma dry etching. In one embodiment, an ICP etch recipe of a gas mixture of $Cl_2$/Ar (30 sccm), pressure (5 mTorr), coil RF power of 700 W and DC-bias of 300 V produces Ni etch rates of 80 nm/min. The Ni metal layer can then be removed, and any surface roughness can be corrected by nP3 or a spin coated polymer followed by a plasma etch back as previously described.

Instead of a contiguous film, the catalyst film can also be pattered onto the diamond surface. Exemplary patterns can include repeating structures, such as dots, lines, and holes in the catalyst film. This can then be etched at high temperatures to enable a thermochemical reaction using exemplary gases, such as water vapor and hydrogen. Regions at higher temperature will etch deeper and this property can be exploited to generate a desired profile underneath the etched pattern. As previously described, laser powered DMDs or catalyst film thickness modulation can be used to generate the spatial temperature profile. If the etch is anisotropic, it can result in nano-pillars or whiskers which can then be removed through an isotropic etch in oxygen plasma at high substrate temperatures. Any remaining surface roughness can be corrected through nP3 followed by a plasma etch back previously described or by a spin-on polymer and etch back.

Figure 19:
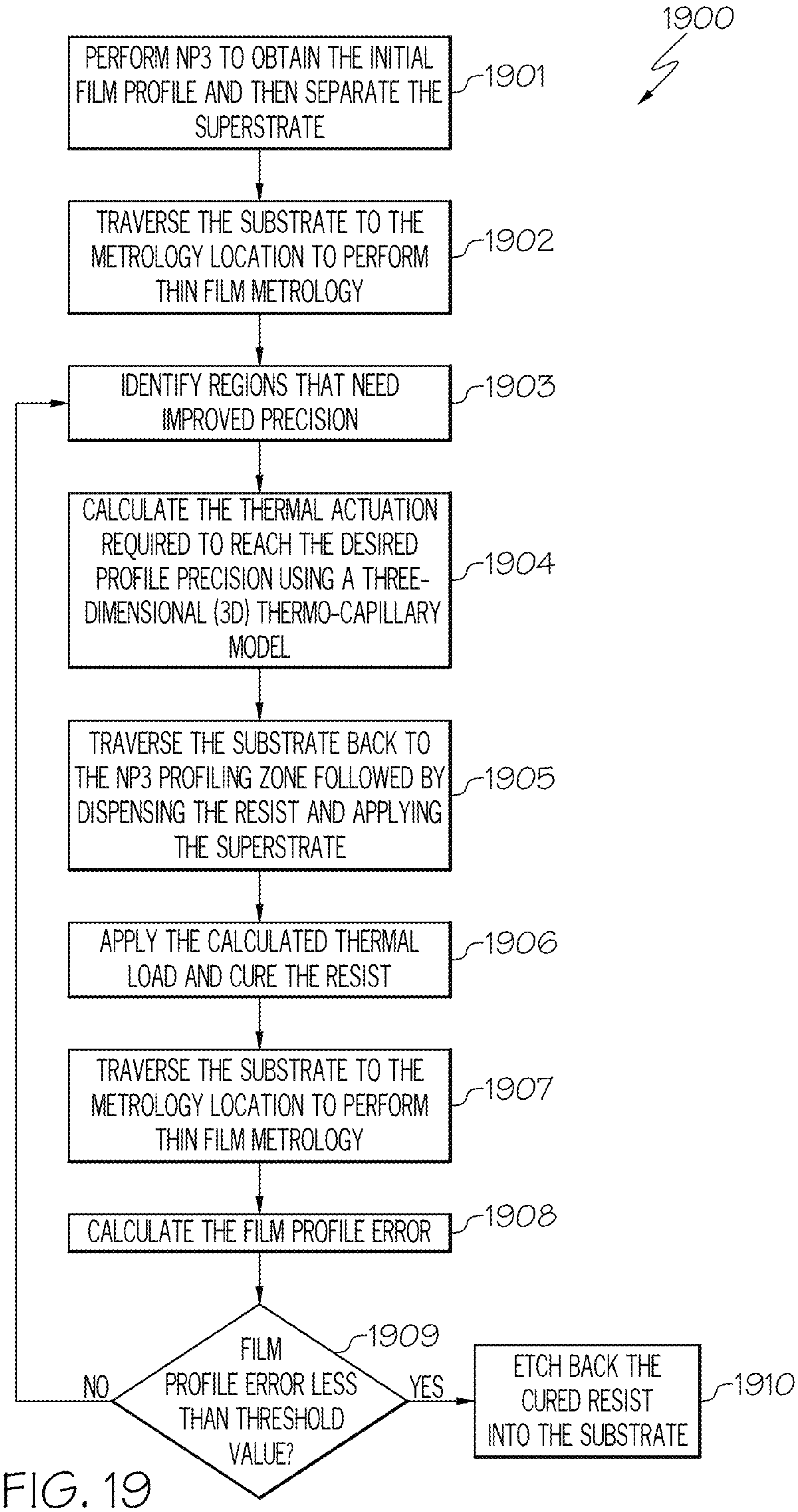
FIG. 19 is a flowchart of a method for the atline nP3-μP process in accordance with an embodiment of the present disclosure.

FIG. 19 is a flowchart of a method 1900 for the atline nP3-μP process in accordance with an embodiment of the present disclosure.

Referring to FIG. 19, in conjunction with FIG. 1, in step 1901, nP3 is performed to obtain the initial film profile and then the superstrate (e.g., superstrate 108) is separated.

In step 1902. the substrate (e.g., substrate 113) is traversed to the metrology location to perform thin film metrology.

In step 1903, regions that need improved precision are identified.

In step 1904, the thermal actuation required to reach the desired profile precision is calculated using a three-dimensional (3D) thermo-capillary model.

In step 1905, the substrate (e.g., substrate 113) is traversed back to the nP3 profiling zone followed by dispensing the resist (e.g., resist 112) and applying the superstrate (e.g., superstrate 108).

In step 1906, the calculated thermal load is applied and the resist is cured.

In step 1907, the substrate (e.g., substrate 113) is traversed to the metrology location to perform thin film metrology.

In step 1908, the film profile error is calculated.

In step 1909, a determination is made as to whether the film profile error is less than a user-designated threshold value. If the film profile error is not less than the user-designated threshold value, then regions that need improved precision are identified in step 1903.

If, however, the film profile error is less than the user-designated threshold value, then, in step 1910, the cured resist is etched back into the substrate.

Figure 20:
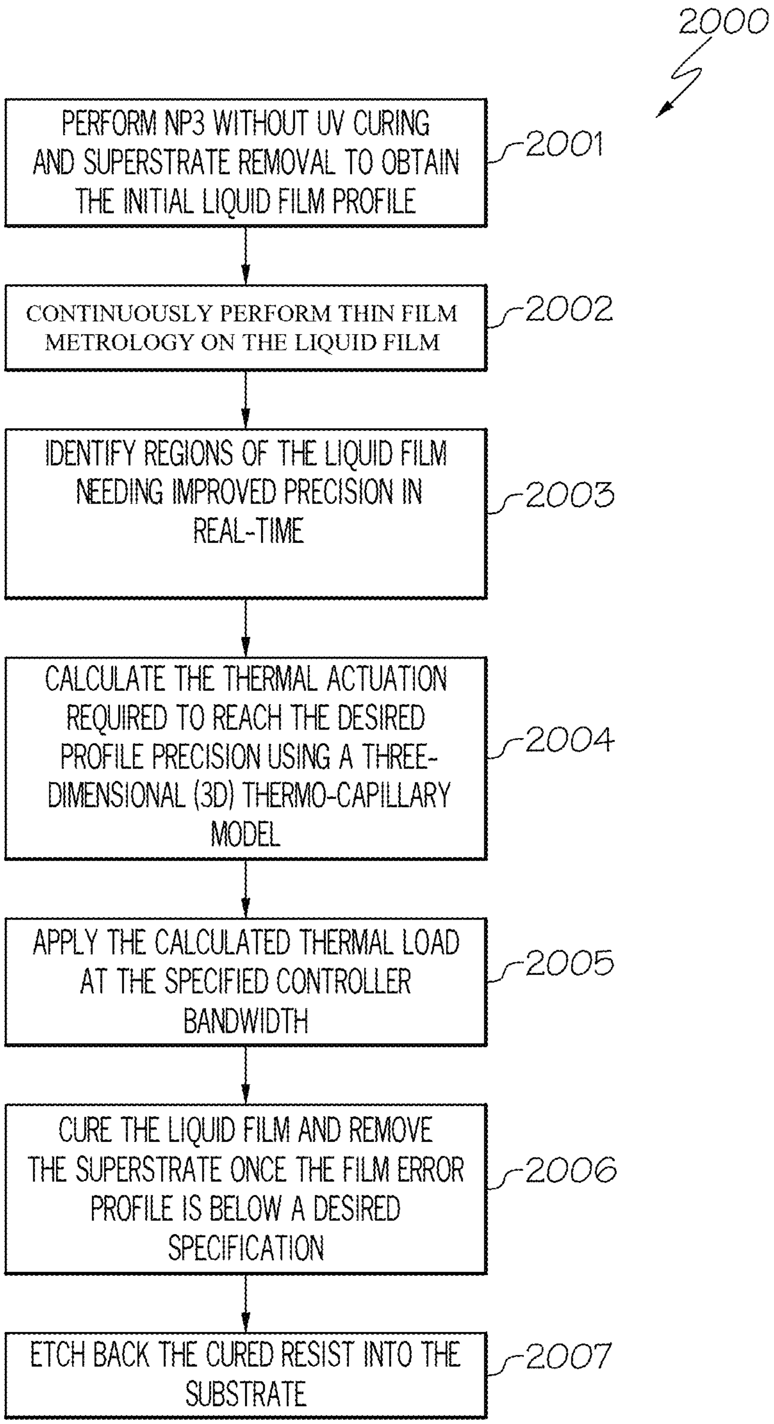
FIG. 20 is a flowchart of a method for real-time nP3-UP in accordance with an embodiment of the present disclosure.

Referring now to FIG. 20, FIG. 20 is a flowchart of a method 2000 for real-time nP3-μP in accordance with an embodiment of the present disclosure.

Referring to FIG. 20, in conjunction with FIG. 1, in step 2001, nP3 is performed without UV curing and superstrate removal to obtain the initial liquid film profile.

In step 2002, thin film metrology on the liquid film is continuously performed.

In step 2003, regions of the liquid film needing improved precision are identified in real-time.

In step 2004, the thermal actuation required to reach the desired profile precision is calculated using a three-dimensional (3D) thermo-capillary model.

In step 2005, the calculated thermal load is applied at the specified controller bandwidth.

In step 2006, once the film error profile is below a desired specification, the liquid film is cured and the superstrate is removed.

In step 2007, the cured resist is etched back into the substrate.

Figure 21B:
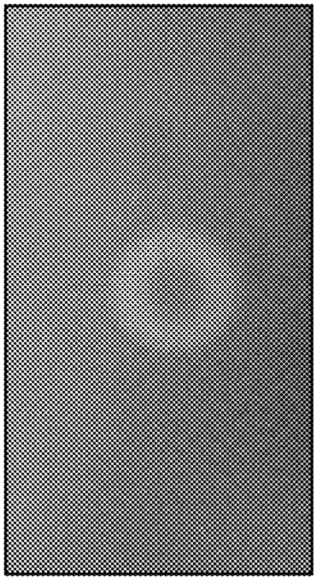
FIGS. 21A-21C illustrate the film thickness evolution for a given thermal input in accordance with an embodiment of the present disclosure.
Figure 21C:
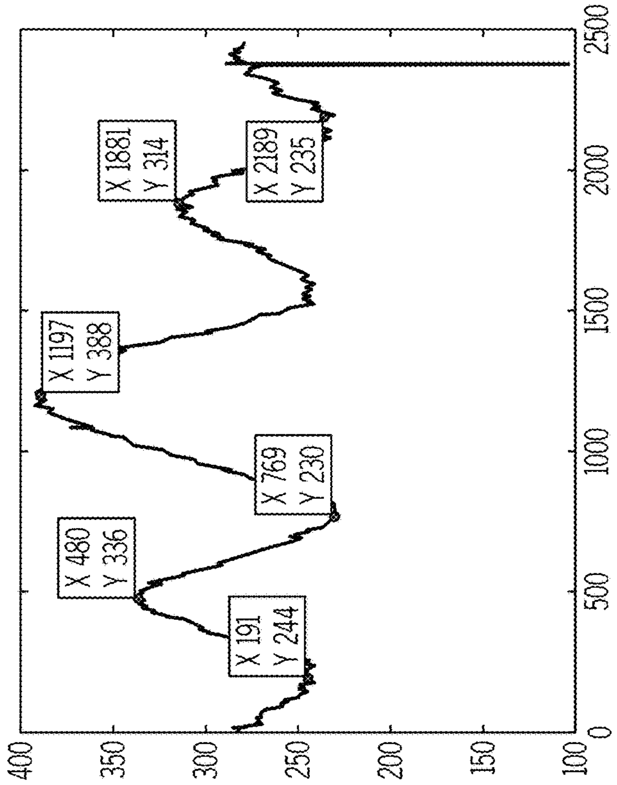
Figure 21A:
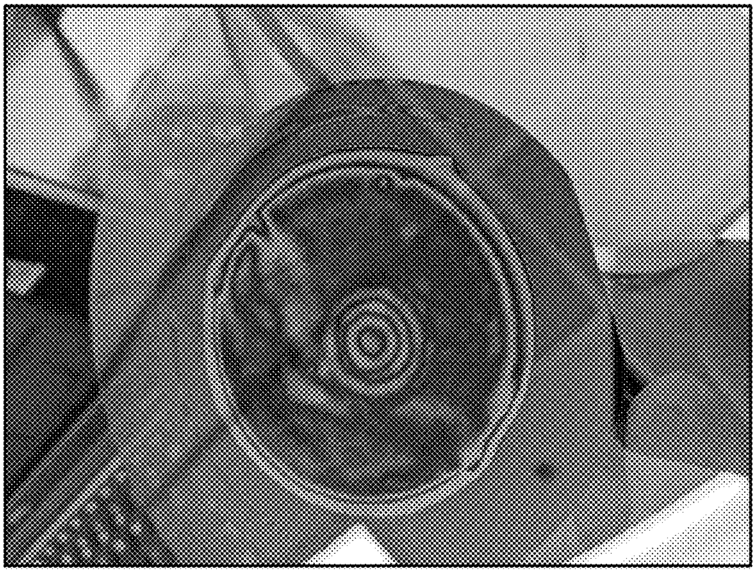
Figure 22A:
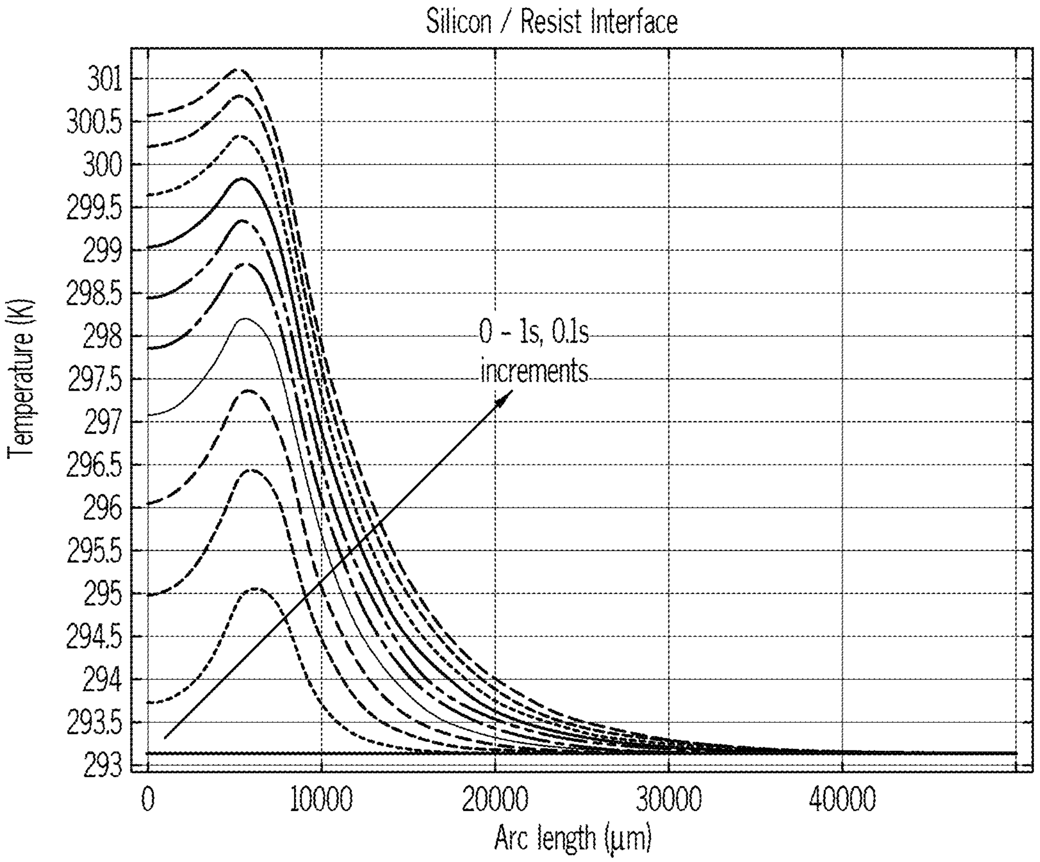
Figure 22B:
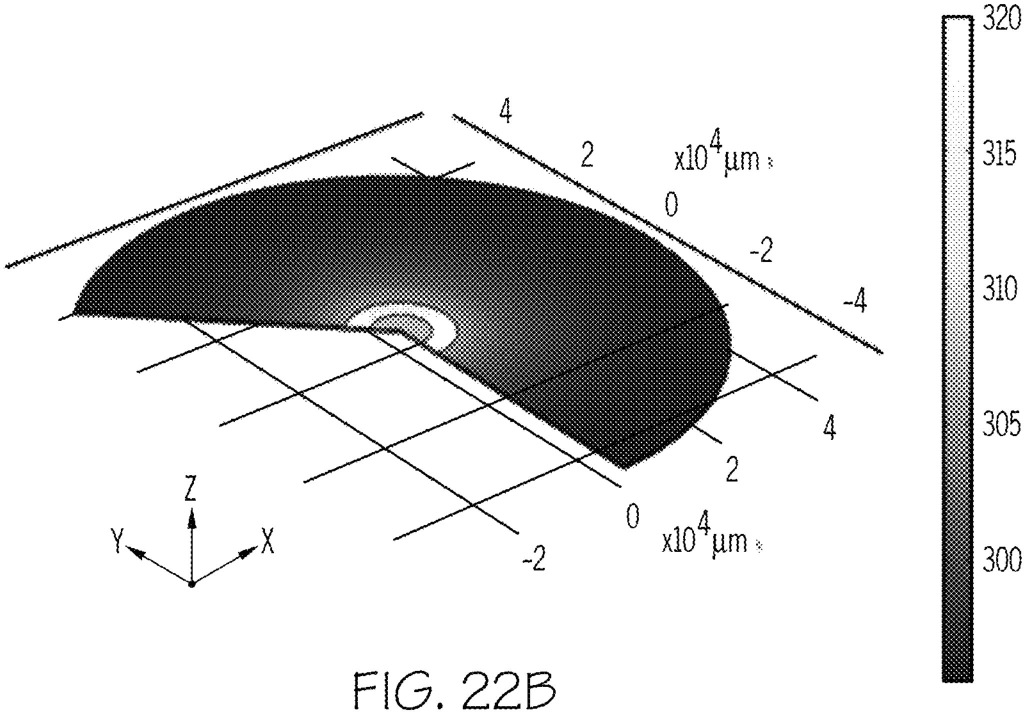
Figure 22C:
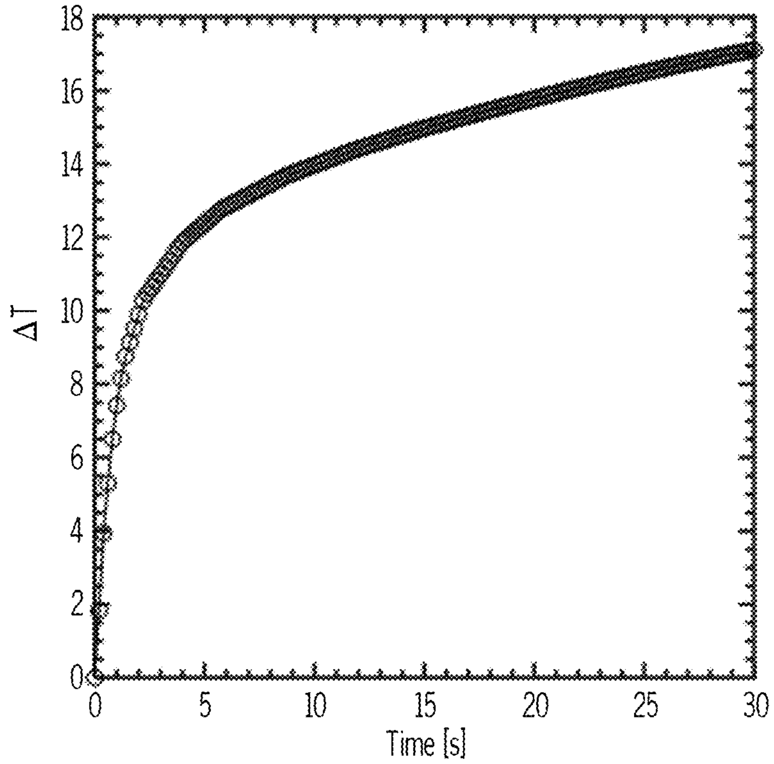
Figure 22D:
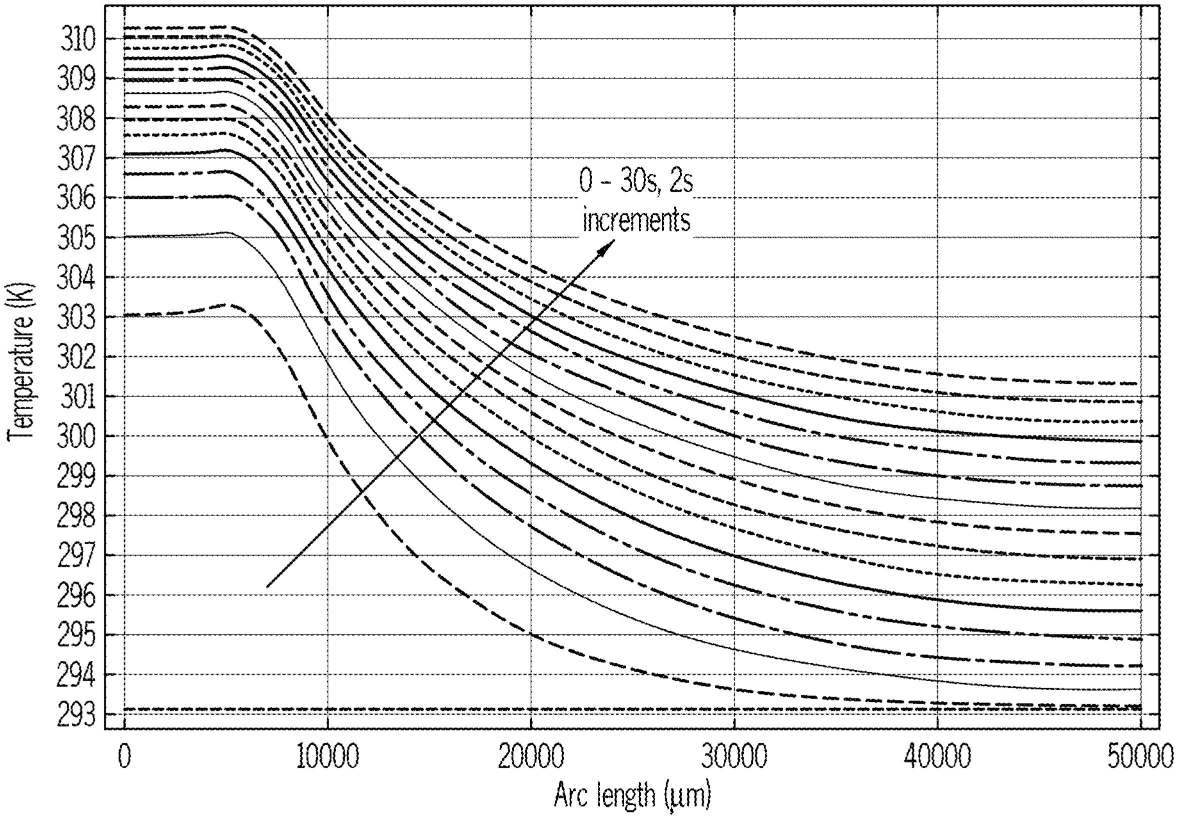

Referring now to FIGS. 21A-21C, FIGS. 21A-21C illustrate the film thickness evolution for a given thermal input (Z axis is in nm and XY coordinates are in pixels, where 1 pixel is 9.4 μm) in accordance with an embodiment of the present disclosure.

FIGS. 21A-21C illustrate the experimental results of thermal actuation of a film stack (e.g., film stack 301) and the resulting change in the local film thickness. In one embodiment, a film stack (e.g., film stack 301) with a Si substrate and a PC superstrate with an Au film is used with a substantially uniform resist film in between. A ring-shaped heat input is applied to the PC superstrate for 5 seconds resulting in a temperature of about 108° F. in the ring region and about 85° F. in the bulk of the region. A film thickness change is observed as shown with a peak of 380 nm and a valley of 240 nm, the average initial film thickness being 280 nm. Once the film profile change is observed, the film is UV cured and film thickness is measured using a large area thin film interference.

FIGS. 22A-22E illustrate the thermal simulations for quantifying the temperature profile based on a heat input at a film stack consisting of a polycarbonate superstrate, a silicon substrate and an imprint resist film in accordance with an embodiment of the present disclosure. It is noted that the temperature profiles are shown at the silicon-resist interface.

Figure 23A:
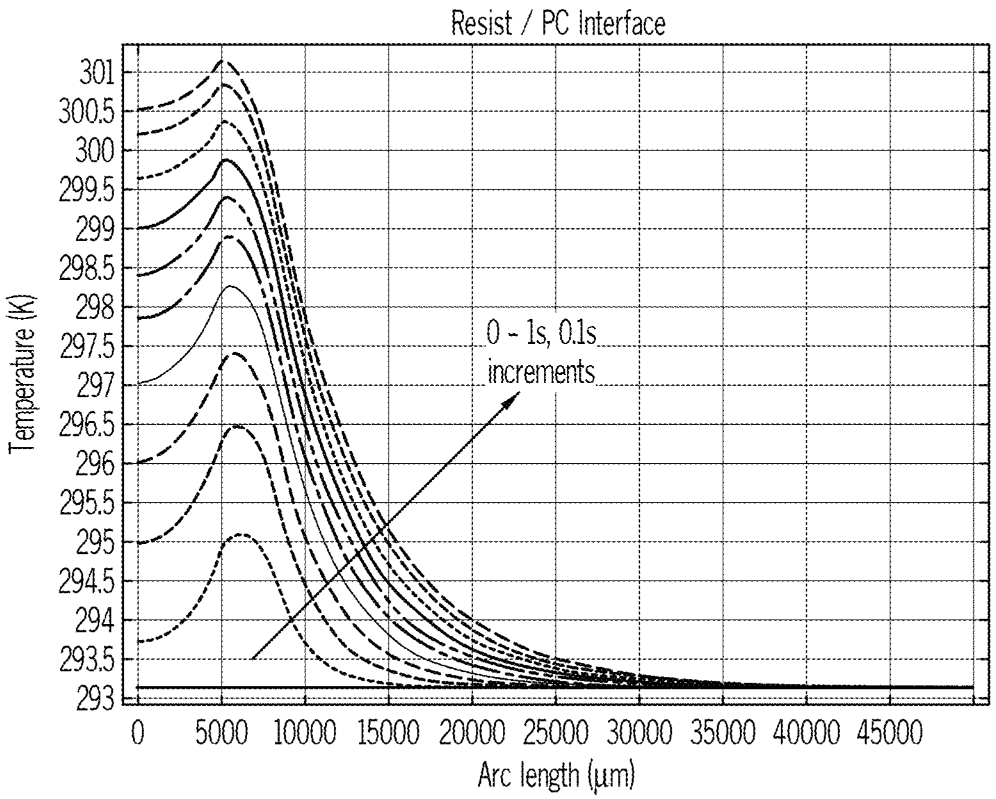
FIGS. 23A-23C illustrate additional thermal simulations for quantifying the temperature profile based on the heat input at a film stack consisting of a polycarbonate superstrate, a silicon substrate and an imprint resist film in accordance with an embodiment of the present disclosure.
Figure 23B:
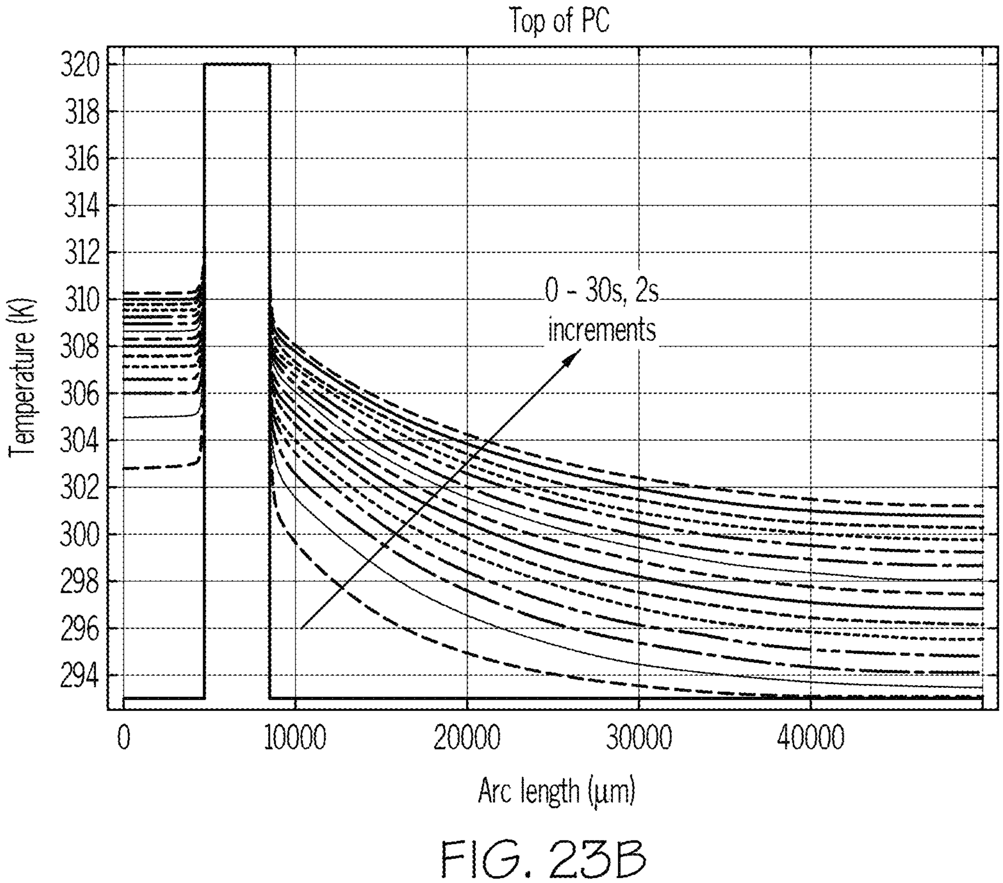
Figure 23C:
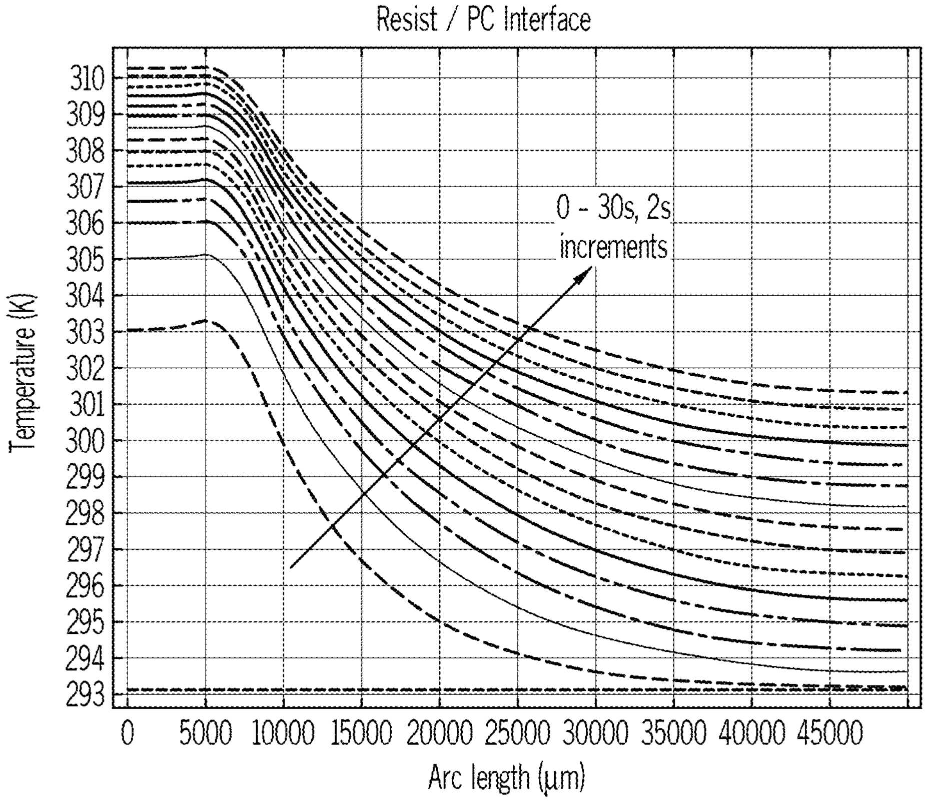
Figures 24A, 24B:
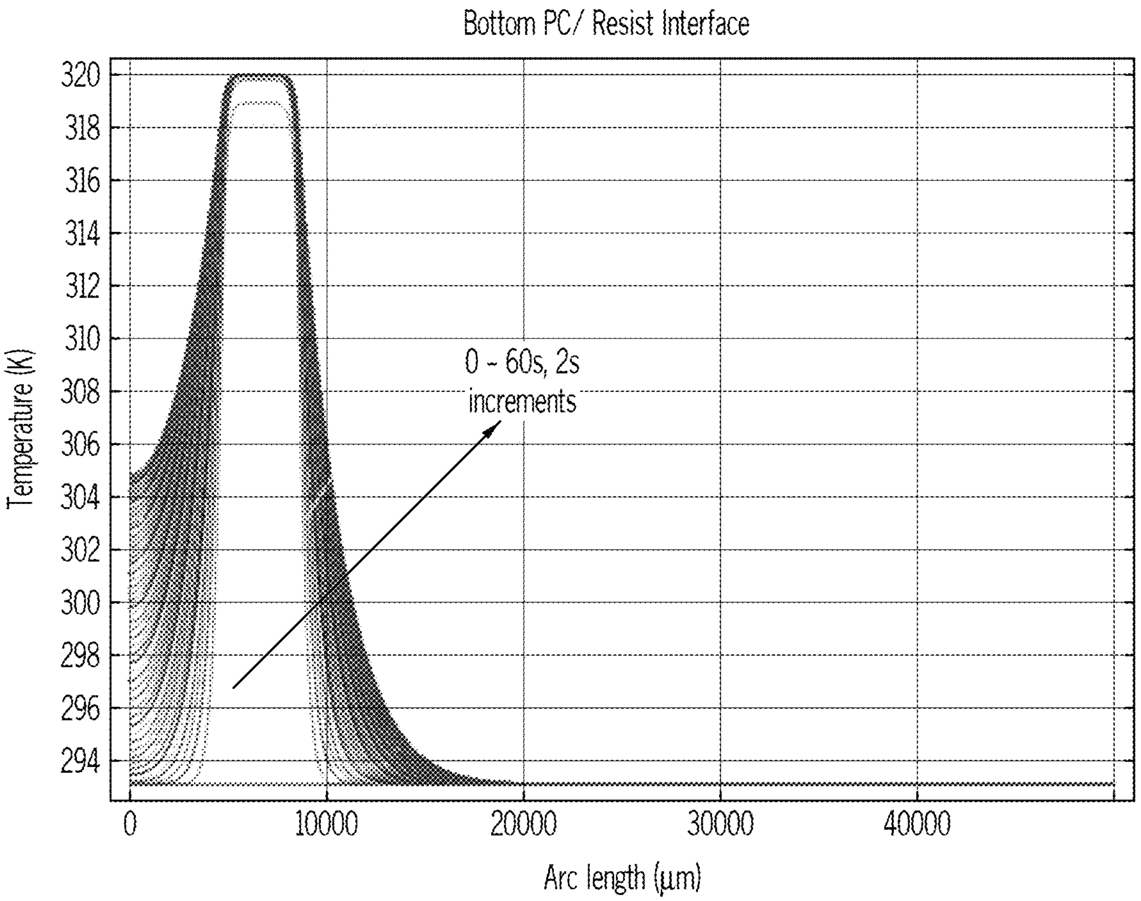
FIGS. 24A-24D illustrate the thermal simulations for quantifying the temperature profile based on the heat input at a film stack consisting of a polycarbonate superstrate, a substrate and an imprint resist film in accordance with an embodiment of the present disclosure.
Figure 24C:
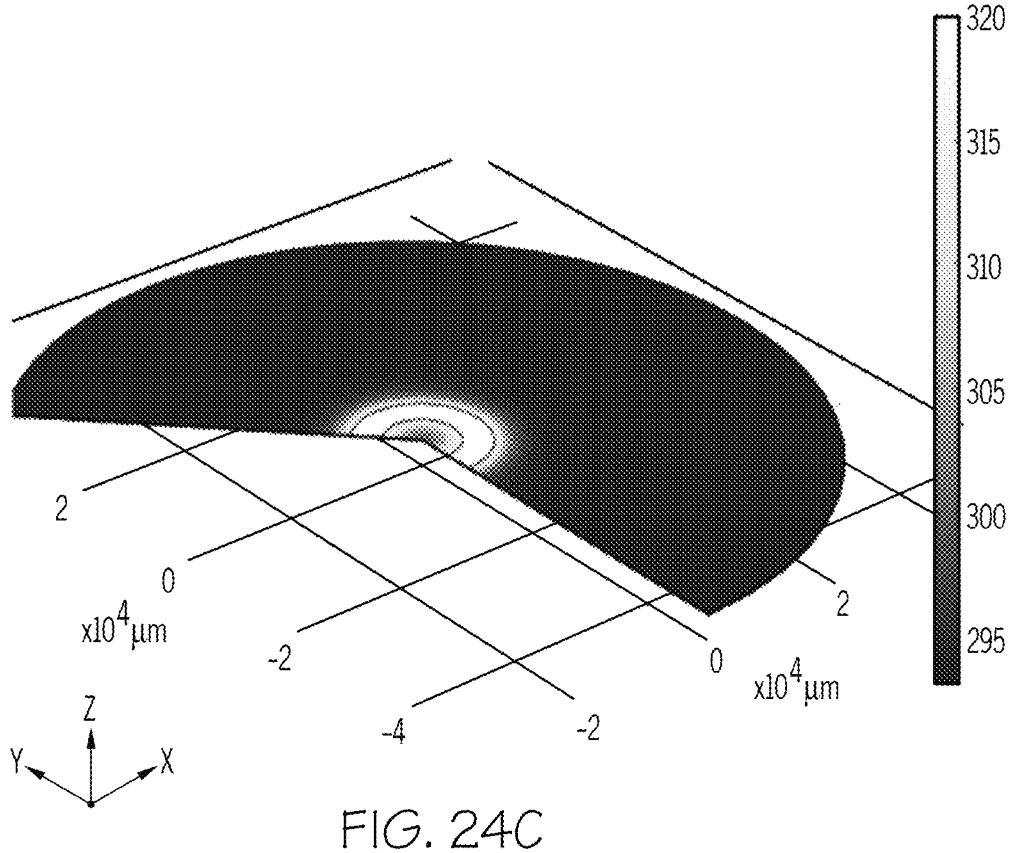
Figure 24D:
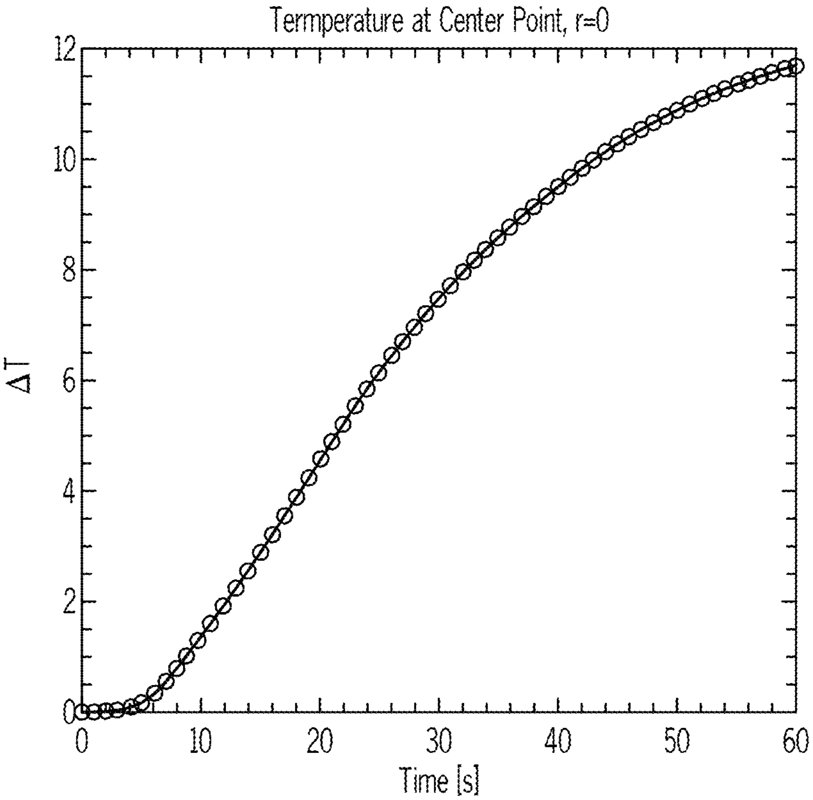

FIGS. 23A-23C illustrate additional thermal simulations for quantifying the temperature profile based on the heat input at a film stack consisting of a polycarbonate superstrate, a silicon substrate and an imprint resist film in accordance with an embodiment of the present disclosure. It is noted that the temperature profiles are shown at the PC-resist interface.

FIGS. 22A-22E and 23A-23C describe results from a transient thermal simulation used to calculate temperature with respect to time at the film stack as a function of an externally applied temperature boundary condition. The film stack used has a PC superstrate, a Si substrate and an acrylic resist whose material properties are tabulated. A ring shaped temperature input of 320 K is applied to the top of the PC superstrate and temperatures at the interfaces are plotted. Temperatures along the radius asymptotically rise to their steady state values. At the silicon-resist interface, the temperature in the inner circular non-heated region is similar to the heated ring region due to the high thermal conductivity of Si. Temperatures at this interface rise to around 310 K within a span of 30 seconds. In FIGS. 23A-23C, temperature profiles at the resist-PC interface are plotted. It is seen that the temperature at the top of the PC wafer is distinctly different in the ring region compared to the non-heated regions due to the low thermal conductivity of the PC. However, temperatures at the PC-resist interface are similar to the resist-Si interface due to nanometer scale liquid film thickness leading to a negligible temperature gradient along the film thickness.

FIGS. 24A-24D illustrate the thermal simulations for quantifying the temperature profile based on the heat input at a film stack consisting of a polycarbonate superstrate, a substrate and an imprint resist film in accordance with an embodiment of the present disclosure. It is noted that temperature profiles are shown at the PC-resist interface.

FIGS. 24A-24D describe the results of a transient thermal simulation with a PC superstrate, a substrate and a resist film. The same temperature boundary condition is applied as shown in the previously mentioned film stack. In this case, a significant temperature difference is maintained between the heated regions and the unheated regions of the PC-resist interface due to the low thermal conductivity of the PC. These simulations are used to quantify the heat spread region and resultant temperature due to the irradiated photons on the film stack from each pixel of the DMD thermal actuator.

Figure 25A:
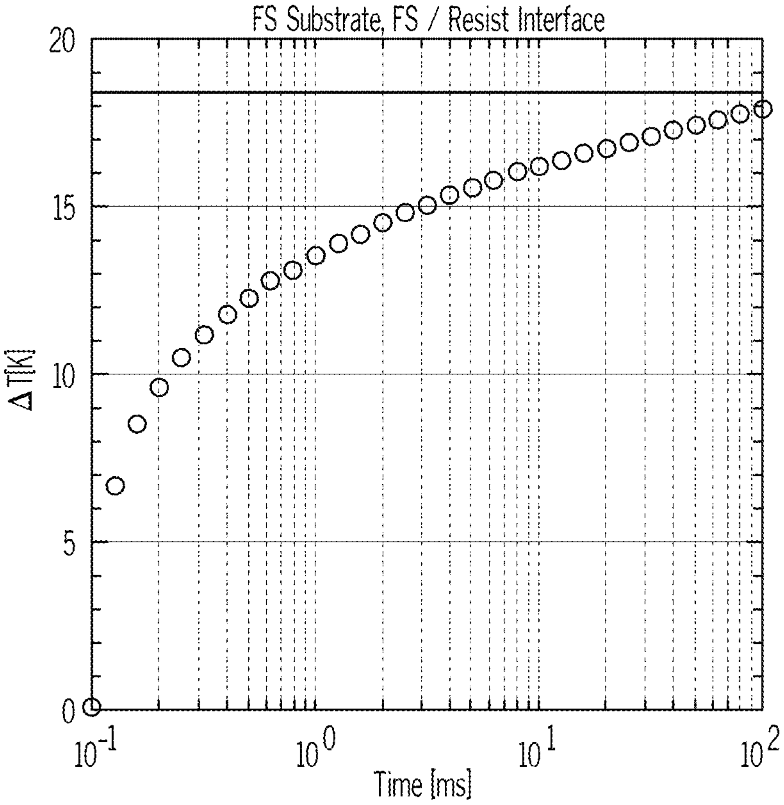
FIGS. 25A-25B illustrate thermal simulations for quantifying temperatures based on the heat input with microscale lateral dimensions at a film stack consisting of a polycarbonate superstrate with an Au film, a fused silica substrate and an imprint resist film in accordance with an embodiment of the present disclosure.
Figure 25B:
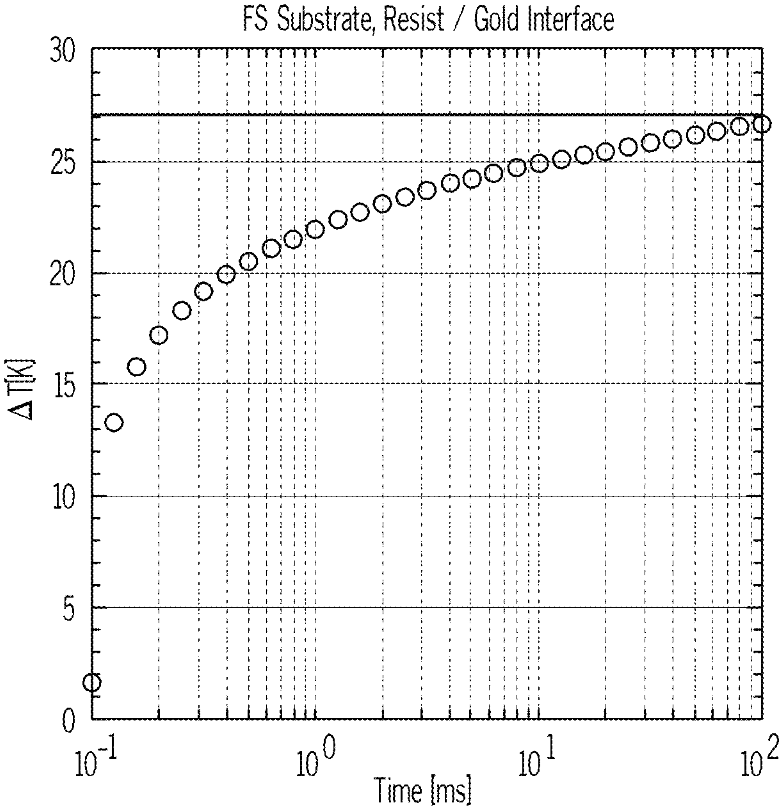

FIGS. 25A-25B illustrate thermal simulations for quantifying temperatures based on the heat input with microscale lateral dimensions at a film stack consisting of a polycarbonate superstrate with an Au film, a fused silica substrate and an imprint resist film in accordance with an embodiment of the present disclosure.

Figure 26:
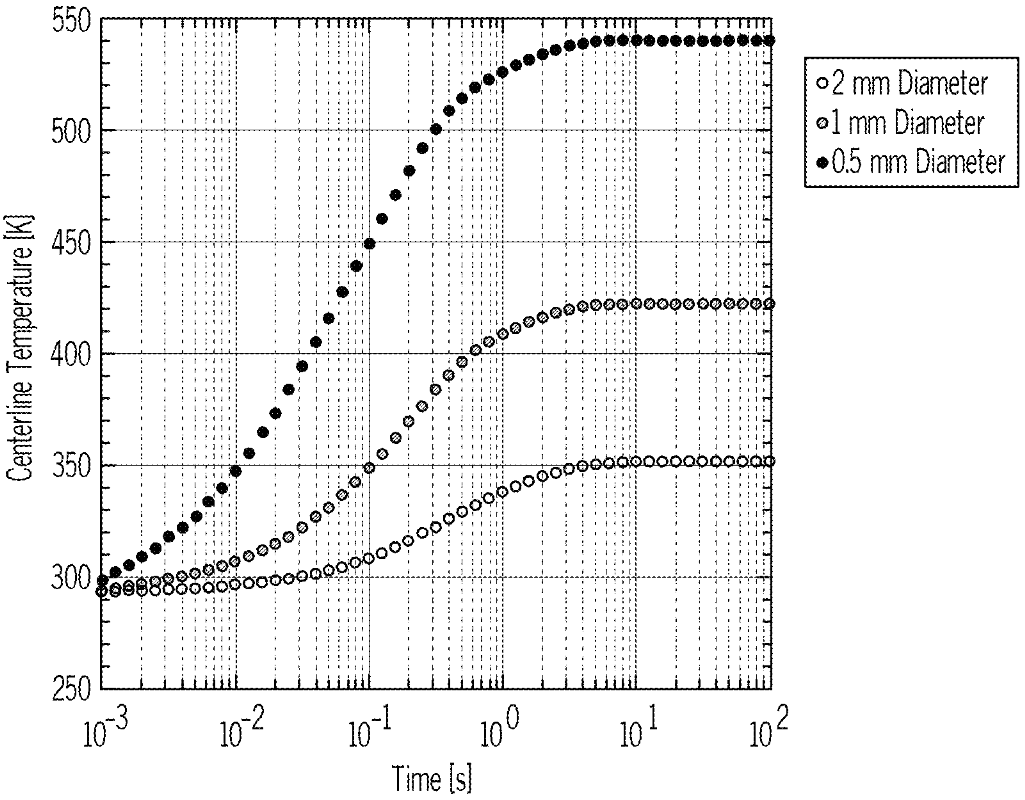
FIG. 26 illustrates thermal simulations for quantifying temperatures based on the heat input with mm-scale lateral dimensions at a film stack consisting of a polycarbonate superstrate with an Au film, a fused silica substrate and an imprint resist film in accordance with an embodiment of the present disclosure.

FIG. 26 illustrates thermal simulations for quantifying temperatures based on the heat input with mm-scale lateral dimensions at a film stack consisting of a polycarbonate superstrate with an Au film, a fused silica substrate and an imprint resist film in accordance with an embodiment of the present disclosure.

FIGS. 25A-25B and 26 show the results of a transient thermal simulation when a heat input is applied to the film stack over various spot sizes and the resultant temperature with respect to time is plotted. The film stack (e.g., film stack 301) used has a fused silica substrate, a PC superstrate with an Au thin film and a liquid resist in between. A 3 mW heat input is applied over a 10 μm diameter circular region. The rise in temperature at the resist-gold and resist-$SiO_2$ interface asymptotically increases to the steady state value in about 100 ms. When a 500 mW heat input is applied over a spot sized of 0.5 mm, 1 mm or 2 mm diameter, the temperature at the gold-resist interface reaches 95% of the steady state value in about 1 second.

Figure 27:
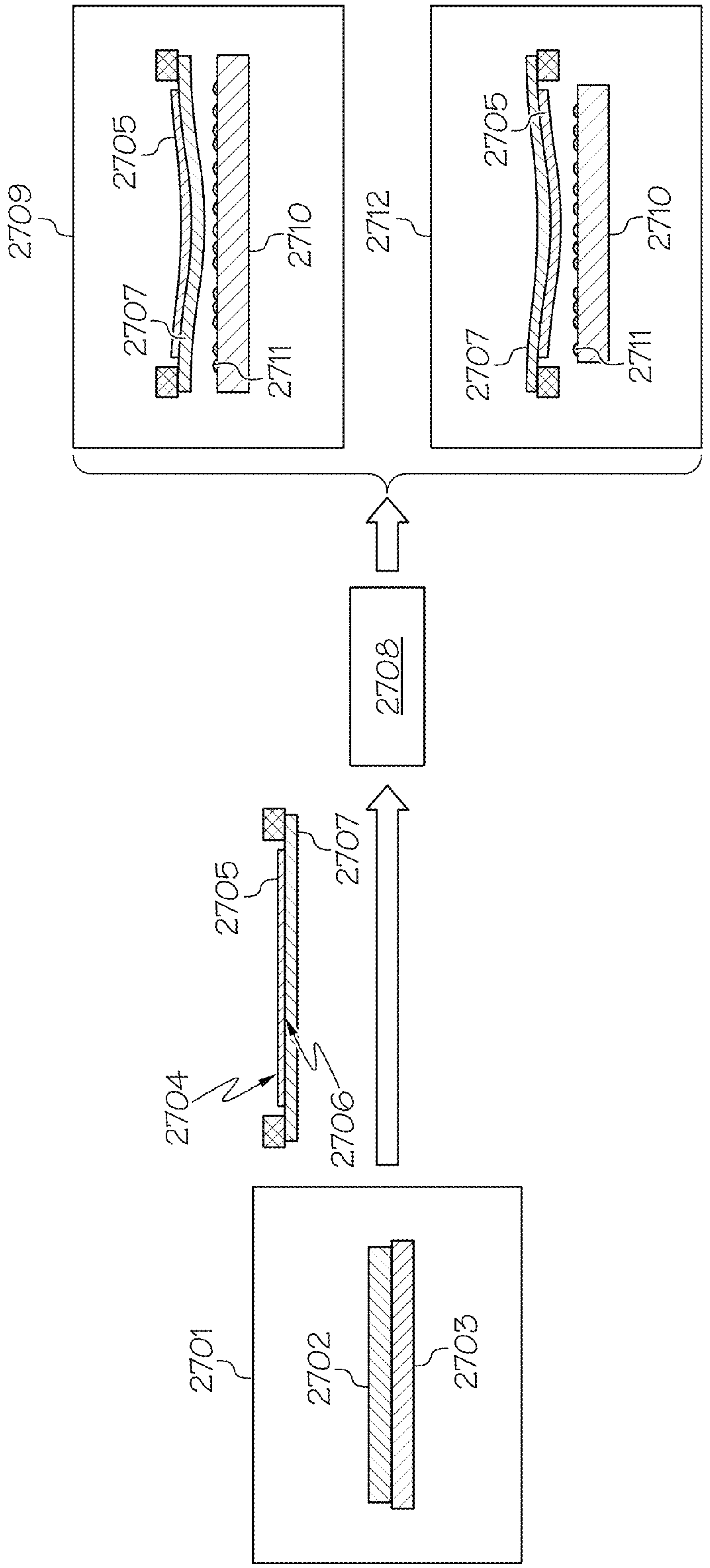
FIG. 27 illustrates a profiling process involving a backgrinding tool in accordance with an embodiment of the present disclosure.

Referring now to FIG. 27, FIG. 27 illustrates a profiling process involving a backgrinding tool in accordance with an embodiment of the present disclosure.

As shown in FIG. 27, FIG. 27 illustrates a backgrinding tool 2701, which is used to perform a coarse, fine grinding and CMP on the source substrate 2702 mounted on a tape frame 2703. In one embodiment, source substrate 2702 is used for modulating stiffness of the tape-frame based profiling template (discussed below). In one embodiment, source substrate 2702 is made silicon, oxide, SiC, alumina, sapphire, metal, polymer-based substrate, etc. In one embodiment, substrate 2702 is one of the following sizes: 50 mm, 100 mm, 150 mm, 200 mm, 300 mm, and 450 mm in diameter (and also any intermediate sizes).

In one embodiment, the output of backgrinding tool 2701 (see element 2704) involves a thinned source substrate 2705, where an adhesive 2706 is between the thinned source substrate 2705 and the film 2707 that is part of the tape film (see 2703). In one embodiment, adhesive 276 is stronger in its cured state in comparison to the cured utilized in the profiling process.

In one embodiment, an optional cleaning of the tape film (e.g., tape film 2703) is performed (see element 2708). In one embodiment, such cleaning is performed using a wet clean (e.g., water rinse, piranha cleaning, SC1/2 cleaning) and/or a dry clean (e.g., plasma clean, cryogenic cleaning, dry carbon dioxide based cleaning).

In one embodiment (see option 1 2709), an nP3 tool is utilized to initiate profiling on substrate 2710 via the use of a tape-frame-based profiling template (showed bowed) which consists of a bowed thinned source substrate 2705 on top of a bowed film 2707. Furthermore, in such an embodiment, inkjetted adhesive 2711 is utilized in the profiling process.

In an alternative embodiment (see option 1 2712), an nP3 tool is utilized to initiate profiling on substrate 2710 via the use of a tape-frame-based profiling template (showed bowed) which consists of a bowed film 2707 on top of a bowed thinned source substrate 2705. Furthermore, in such an embodiment, inkjetted adhesive 2711 is utilized in the profiling process.

In one embodiment, the nP3-μP process is used to fabricate ultra-precision optical components, such as mirrors, lenses and corrector plates. In one embodiment, these optical components are used for laser beam shaping optics, such as gaussian-to-flat corrector pates. In one embodiment, the nP3 process is used to control the TTV (total thickness variation) of semiconductor wafers, where such wafers can have a thickness ranging from 20 micrometers to 1.5 mm.

As a result of the foregoing, the embodiments of the present disclosure provide a means for providing high-throughput fabrication of functional nanostructures with complex geometries on planar and non-planar substrates.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The invention claimed is:

1. A system for nanoscale precision programmable profiling of a substrate using a superstrate, the system comprising:

a profiling module, wherein said profiling module dispenses profiling material using one or more of the following techniques to dispense said profiling material: inkjet dispense, slot-die coating, and gravure coating;

a subsystem for handling said superstrate, wherein said superstrate is a flexible material and is used to form a contiguous film of said profiling material between said superstrate and said substrate, wherein said flexible material is in one of the following configurations: plate, wafer, sheet, roll-to-roll, and tape frame;

a film stack comprising said superstrate, said substrate and said profiling material in between said superstrate and said substrate, where said film stack absorbs energy from photons in one or more bands in a wavelength range between 200 nm and 15 μm, wherein there is a refractive index difference at an interface in said film stack;

a metrology module comprising a film thickness measurement subsystem, wherein said refractive index difference enables said film thickness measurement subsystem to measure a thickness profile of said profiling material;

a thermal actuation subsystem to locally heat said film stack to enable movement of said profiling material, wherein said thermal actuation subsystem comprises one or more devices capable of generating, transferring, or controlling heat within said film stack by a thermal transport mechanism including radiation, conduction, convection, or combinations thereof; and a curing module for curing said profiling material.

2. The system as recited in claim 1, wherein said film thickness measurement subsystem comprises a broadband light source or a multi-wavelength light emitting diode (LED) source.

3. The system as recited in claim 1, wherein said thermal actuation subsystem comprises a digital micromirror array.

4. The system as recited in claim 1, wherein said superstrate comprises materials that absorb visible wavelengths and/or infrared wavelengths while simultaneously being transparent to ultraviolet (UV) wavelengths.

5. The system as recited in claim 1, wherein said substrate transmits light in one or more bands within a range of wavelengths between 200 nm and 15 μm.

6. The system as recited in claim 1, wherein said thermal actuation subsystem comprises a two-dimensional motorized stage to direct photonic irradiation to a portion of said film stack.

7. The system as recited in claim 1, wherein said superstrate has one or more layers, wherein said one or more layers absorb a band of wavelengths between 200 nm and 15 μm.

8. The system as recited in claim 1, wherein said substrate has one or more layers, wherein said one or more layers absorb a band of wavelengths between 200 nm and 15 μm.

9. The system as recited in claim 1, wherein said system is used for a process for atline control in said nanoscale precision programmable profiling, wherein said process comprises:

forming a first film stack by bringing a superstrate in contact to a substrate with a first liquid profiling material in between said superstrate and said substrate;

curing said first liquid profiling material to result in a first solidified profiling material after a first predetermined time of film evolution using one or more of the following techniques: ultraviolet (UV) curing, thermal curing, and visible light curing;

removing said superstrate from said first solidified profiling material;

measuring a film thickness of said first solidified profiling material on said substrate;

forming a second film stack by bringing said superstrate in contact to said substrate with a second liquid profiling material in between said superstrate and said substrate;

applying a thermal load to said second liquid profiling material for film evolution; and curing said second liquid profiling material to result in a second solidified profiling material after a second predetermined time of film evolution.

10. The system as recited in claim 1, wherein said system is used for a process for inline closed loop control in said nanoscale precision programmable profiling, wherein said process comprises:

forming a film stack by bringing a superstrate in contact to a substrate with a liquid profiling material in between said superstrate and said substrate;

continuously measuring a film thickness of said liquid profiling material on said film stack;

applying a thermal actuation for evolution of said liquid profiling material to minimize an error between said measured film thickness of said liquid profiling material and a desired liquid film profile;

curing said liquid profiling material to result in a solidified profiling material when said error is below a desired specification; and removing said superstrate from said solidified profiling material.

11. The system as recited in claim 1, wherein said system is used for a nanoscale precision programmable profiling process for depositing intentionally non-uniform films for controlling a total thickness variation of semiconductor wafers, wherein said nanoscale precision programmable profiling process comprises:

obtaining a desired non-uniform film thickness profile;

solving an inverse optimization program to obtain a volume and a location of dispensed drops so as to minimize a norm of error between said desired non-uniform film thickness profile and a final film thickness profile consistent with a desired final profile of said semiconductor wafers such that a volume distribution of said final film thickness profile is a function of said volume and said location of said dispensed drops;

dispensing drops of a pre-cursor liquid organic material at a plurality of locations on a wafer by an array of inkjet nozzles;

closing a gap between a superstrate and said wafer to form a contiguous film captured between said wafer and said superstrate;

obtaining a time to a non-equilibrium transient state of said superstrate, said contiguous film and a substrate by using said inverse optimization scheme;

curing said contiguous film to solidify it into a polymer; and separating said superstrate from said polymer thereby leaving a polymer film on said wafer, wherein said wafer has an initial nominal thickness ranging from 20 micrometers to 1.5 mm.

* * * * *